United States Patent
Tanaka et al.

(10) Patent No.: US 7,463,495 B2
(45) Date of Patent: Dec. 9, 2008

(54) OPTICAL MODULE CAGE MOUNTING STRUCTURE

(75) Inventors: Hironori Tanaka, Kawasaki (JP); Akira Sawada, Kawasaki (JP); Mitsuaki Hayashi, Kawasaki (JP); Minoru Fujii, Kawasaki (JP); Wataru Takano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/474,456

(22) Filed: Jun. 26, 2006

(65) Prior Publication Data

US 2007/0223208 A1 Sep. 27, 2007

(30) Foreign Application Priority Data

Mar. 27, 2006 (JP) .............................. 2006-086534

(51) Int. Cl.
*H05K 7/02* (2006.01)

(52) U.S. Cl. ...................... 361/807; 361/742; 361/758; 361/730; 361/752; 361/709; 174/520; 385/92; 439/607

(58) Field of Classification Search ................ 361/742, 361/804, 728–730, 752, 807–810, 704, 707, 361/710; 174/520; 385/92; 439/607
See application file for complete search history.

(56) References Cited

U.S. PATENT DOCUMENTS

| | | | | |
|---|---|---|---|---|
| 5,329,428 A | * | 7/1994 | Block et al. ................. | 361/785 |
| 6,443,768 B1 | * | 9/2002 | Dirkers et al. ............... | 439/607 |
| 6,469,905 B1 | * | 10/2002 | Hwang ....................... | 361/756 |
| 6,524,134 B2 | * | 2/2003 | Flickinger et al. ........... | 439/607 |
| 6,612,868 B2 | * | 9/2003 | Hwang ....................... | 439/607 |
| 6,980,437 B2 | * | 12/2005 | Bright ........................ | 361/704 |
| 6,991,471 B2 | | 1/2006 | Hayashi et al. .............. | 439/61 |
| 2003/0027440 A1 | * | 2/2003 | Birch et al. ................. | 439/76.1 |

FOREIGN PATENT DOCUMENTS

JP 2005-116751 4/2005

* cited by examiner

*Primary Examiner*—Dean A. Reichard
*Assistant Examiner*—Dameon E Levi
(74) *Attorney, Agent, or Firm*—Hanify & King, P.C.

(57) ABSTRACT

An optical module cage mounting structure is disclosed. In the module cage mounting structure, an optical module cage including a cage body with a box shape into which an optical module is inserted is mounted on a printed circuit board such that the cage body is spaced apart from a face of the printed circuit board.

14 Claims, 29 Drawing Sheets

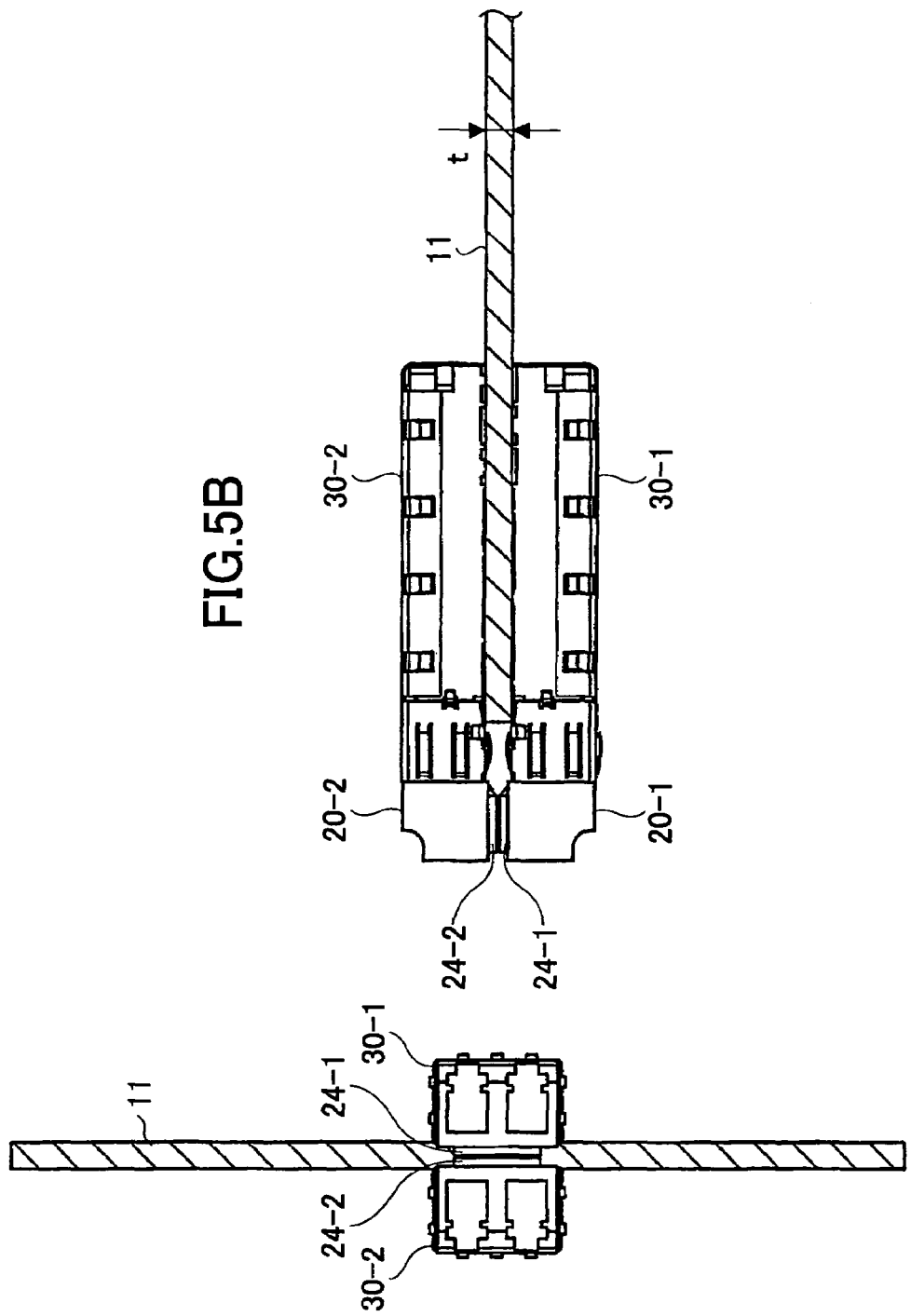

FIG.6A
FIG.6B
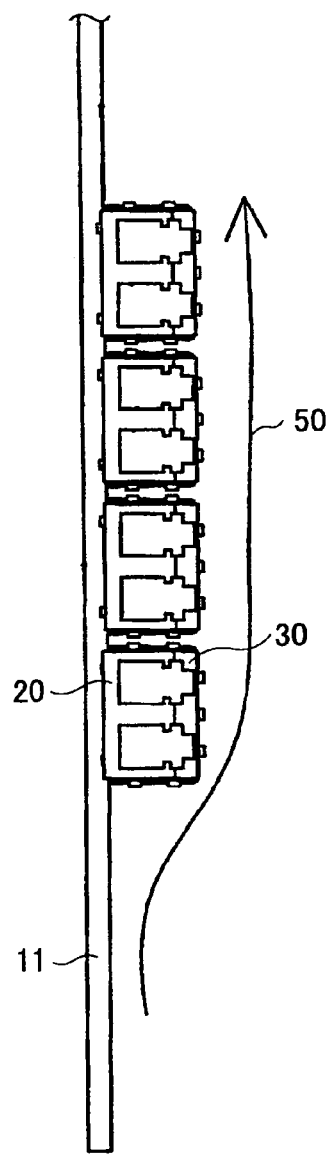
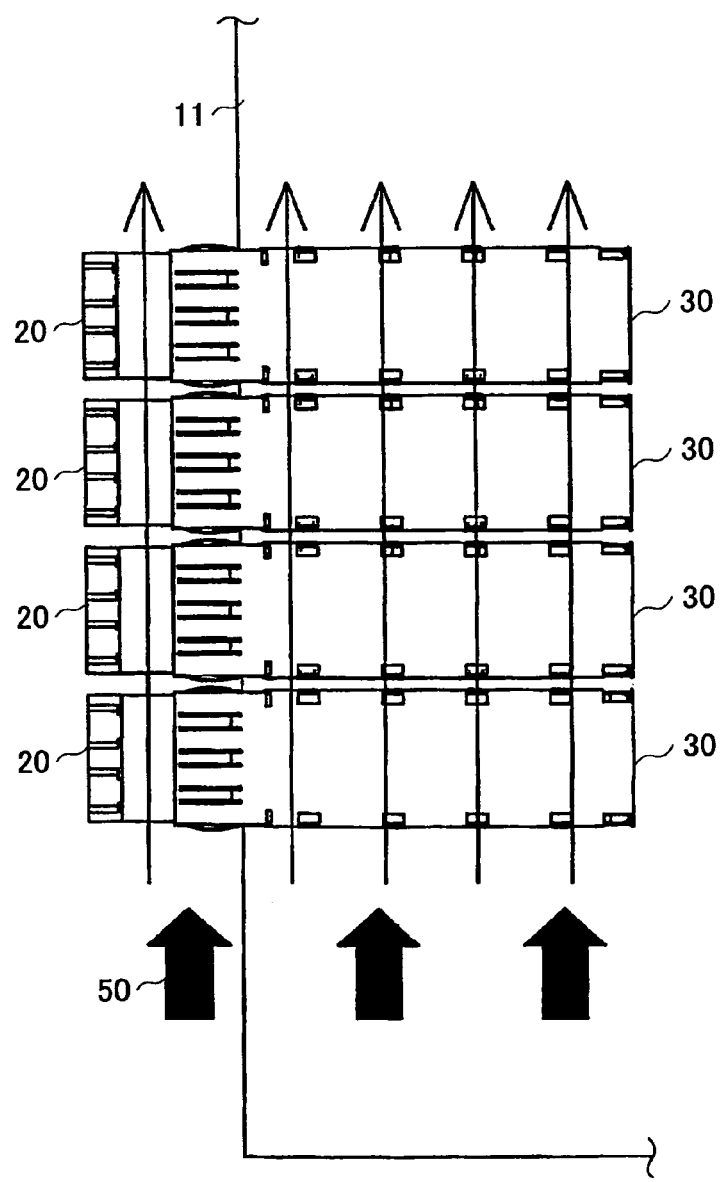

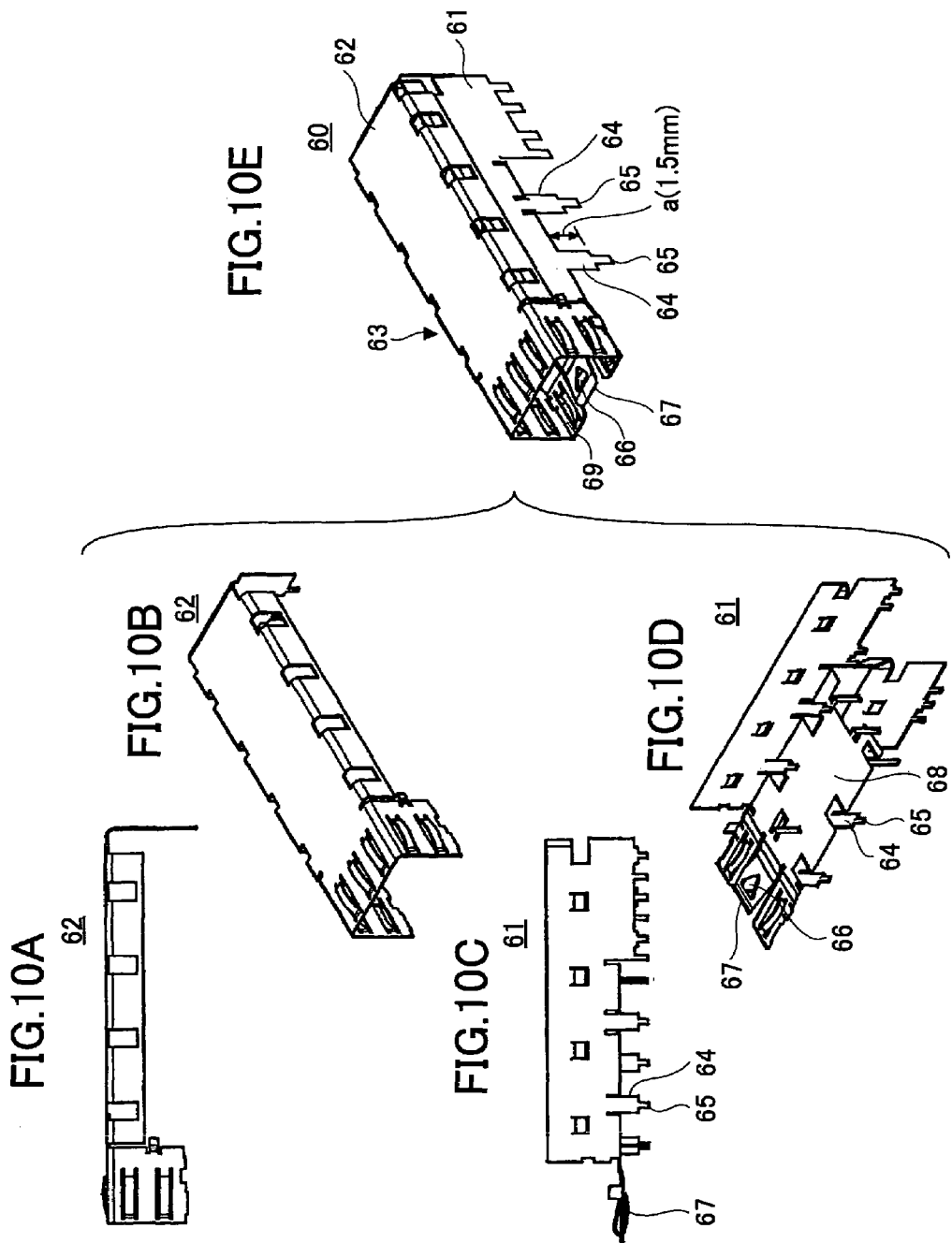

FIG.22B    FIG.22A
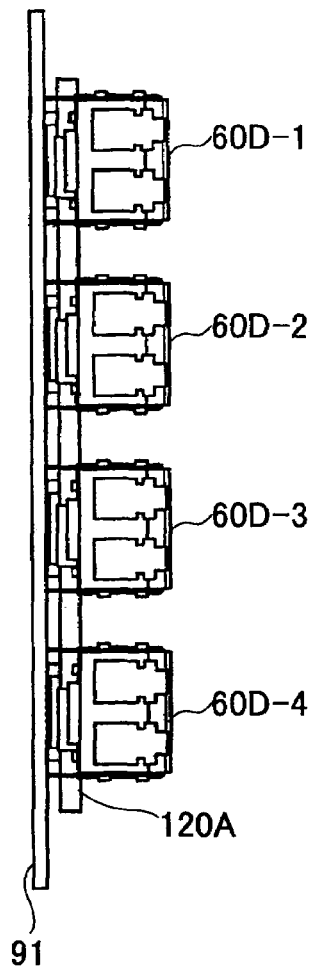
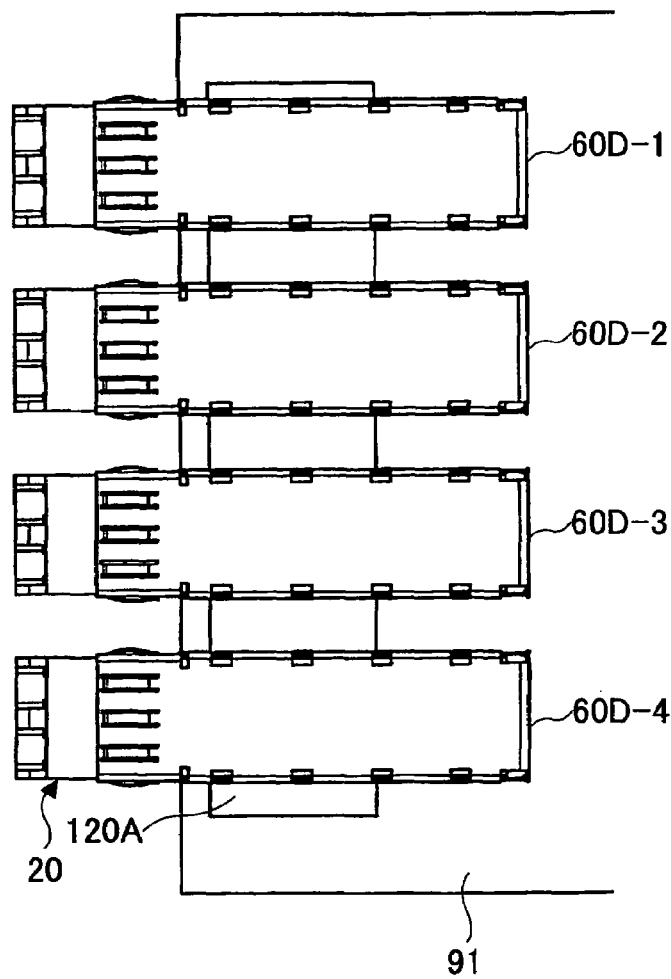
FIG.22C
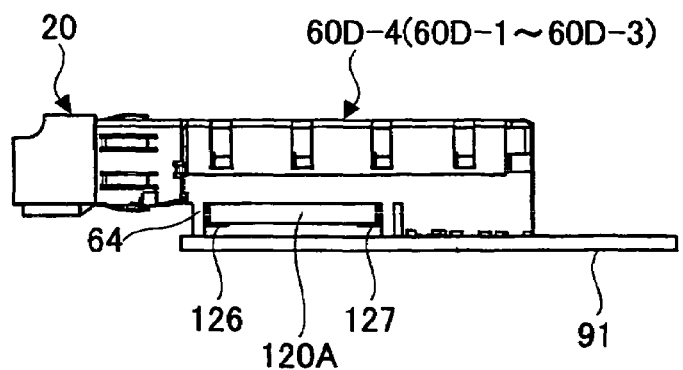

OPTICAL MODULE CAGE MOUNTING STRUCTURE

BACKGROUND OF THE INVENTION

1. Field of the Invention

The present invention generally relates to an optical module cage mounting structure, and particularly relates to a structure for mounting an optical module cage on a printed circuit board of a plug-in unit to be attached to a device casing.

2. Description of the Related Art

FIG. 1 schematically illustrates a communication device 1. The communication device 1 comprises a device casing 2 in which plural plug-in units 10 are aligned and mounted. An optical fiber 5 is connectable from the outside to the plug-in units 10.

There is a strong demand for devices such as the communication device 1 to initially include only circuits for necessary lines for minimizing initial investment, to allow adding optical modules without suspending services each time lines are added, and to allow replacing existing optical modules with other optical modules for different transmission distances.

In each plug-in unit 10, plural optical module cages 12-1, 12-2, and 12-3 are aligned and mounted at the front edge of a printed circuit board 11 such that optical modules 20 (FIGS. 2A - 2E) are attachable thereto. Connectors 13-1, 13-2, and 13-3 are mounted on the printed circuit board 11 and accommodated in the rear parts of the optical module cages 12-1, 12-2, and 12-3, respectively. While, for purposes of simplicity of explanation, the three optical module cages 12-1-12-3 are shown in FIG. 1, more than three optical module cages are actually provided.

Each of the optical module cages 12-1-12-3 is formed in a box shape with an insertion slot 12-1a at an end, and has a lock piece 12-1c with a lock hole 12-1b in the position facing the insertion slot 12-1a.

In FIG. 1, the optical module 20 is inserted in and attached to only the uppermost optical module cage 12-1. A plug 6 provided at the end of the optical fiber 5 is connected to the optical module 20. The other optical module cages 12-2 and 12-3 are empty. In case of adding lines, additional optical modules 20 are inserted in and attached to the optical module cages 12-2 and 12-3. This configuration enables reducing initial investment and adding optical modules 20 when adding lines.

FIGS. 2A-2E show the optical module 20. The optical module 20 is a SFP (Small Form-Factor Pluggable) type and comprises a pair of optical plug sockets 21 and 22 at an end, a light emitting element, a light receiving element, and a photoelectric transducer (not shown) thereinside, and a card edge terminal group section 23 at the other end. A lock release knob 24 slidable in a direction A (FIG. 2D) and a lock projection 25 are disposed on the bottom face of the optical module 20 at the side where the optical plug sockets 21 and 22 are provided.

The optical module 20 is inserted, from the end where the card edge terminal group section 23 is provided, all the way into the optical module cage 12-1 such that the card edge terminal group section 23 is connected to the connector 13-1. The lock projection 25 is engaged by the lock hole 12-1b, so that the optical module 20 is attached inside the optical module cage 12-1.

When the lock release knob 24 is pushed and slid in the direction A, the lock piece 12-1c is flexed so as to disengage the lock projection 25 from the lock hole 12-1b. The unlocked optical module 20 is pulled out and removed from the optical module cage 12-1.

As described above, the communication device 1 is configured to allow adding optical modules 20 when adding lines, and to allow replacing the optical modules 20 with other modules when replacing interfaces.

Currently, there is a demand for increasing capacity of backbone networks to handle growing data traffic due to an increase of data and popularization of the Internet. Accordingly, electronic devices for optical communication systems that multiplex optical signals are required to have a higher density, a greater data transmission capacity, and more sophisticated functions. To meet such demands, as many optical modules as possible need to be mounted occupying less space so as to increase the number of lines per device.

FIG. 3A shows a related-art optical module cage 30. The optical module cage 30 comprises a cage body 31 in which the optical module 20 is inserted and leads 32 extending from the cage body 31.

The leads 32 are inserted into through holes in a printed circuit board 11 and soldered to the printed circuit board 11 such that, as shown in FIG. 3B, the optical module cage 30 is mounted on the printed circuit board 11 with its bottom plate 33 in contact with a face 11a of the printed circuit board 11.

<Patent Document 1>Japanese Patent Laid-Open Publication No. 2005-116751

This configuration has the following four problems.

(1) As shown in FIG. 4, optical module peripheral electronic components 40 of filter circuits, etc., for the optical modules 20 are mounted outside the area on the printed circuit board 11 where the optical module cages 30 are mounted. Accordingly, spaces 41 for mounting the electronic components 40 need to be provided between the adjacent optical module cages 30, which makes it difficult to mount a sufficient number of optical module cages 30.

(2) For mounting more optical module cages 30, optical module cages 30-1 and 30-2 may be mounted, as shown in FIGS. 5A and 5B, in an opposing relationship on opposite faces of the printed circuit board 11. However, if the thickness of the printed circuit board 11 is 3 mm or less (as in many cases), a lock release knob 24-1 of an optical module 20-1 attached to the optical module cage 30-1 and a lock release knob 24-2 of an optical module 20-2 attached to the opposing optical module cage 30-2 interfere with each other and make it difficult to perform unlocking operations for removal of the optical modules 20-1 and 20-2.

(3) The optical modules 20 include therein components that are easily affected by heat. As these components need to be effectively cooled during use, forced air cooling is used for the optical module cages 30. However, in the case where plural optical module cages 30 are aligned and mounted as shown in FIGS. 6A and 6B, air passes through only at the upper side of the optical module cages 30 without sufficiently cooling the optical module cages 30 disposed downwind, especially. Therefore, the optical modules 20 attached to the optical module cages 30 disposed downwind are often subjected to severe thermal conditions.

(4) The optical module cage 30 is usually mounted, as shown in FIG. 3B, with its insertion slot side projecting outward beyond the edge of the printed circuit board 11 so as to prevent a lock piece 30c from interfering with the printed circuit board 11. If the entire part of the optical module cage 30 is located on the printed circuit board 11, the area of the printed circuit board 11 facing the lock piece 30c needs to be cut off to prevent interference with the lock piece 30c. Cutting off the area of the printed circuit board 11 facing the lock piece 30c reduces the area for mounting the optical module peripheral electronic components 40.

SUMMARY OF THE INVENTION

The present invention may solve one or more of the above problems.

According to an aspect of the present invention, there is provided an optical module cage mounting structure wherein an optical module cage, including a cage body with a box shape into which an optical module is inserted, is mounted on a printed circuit board such that the cage body is spaced apart from a face of the printed circuit board.

With this configuration, space is formed between the cage body and the printed circuit board. This space can be used as an area for mounting optical module peripheral electronic components, an area for air passage for forced air cooling, and/or an area for accommodating a heat sink.

BRIEF DESCRIPTION OF THE DRAWINGS

FIGS. 5A and 5B are diagrams for illustrating the second problem of the related-art optical module cage;

FIGS. 6A and 6B are diagrams for illustrating the third problem of the related-art optical module cage;

FIGS. 10A-10E are diagrams showing an optical module cage of FIGS. 7A-7C;

FIGS. 22A-22C are diagrams showing an optical module cage mounting structure according to Embodiment 7 of the present invention;

DETAILED DESCRIPTION OF THE PREFERRED EMBODIMENT

The following describes preferred embodiments of the present invention.

Embodiment 1

Figure 7A:
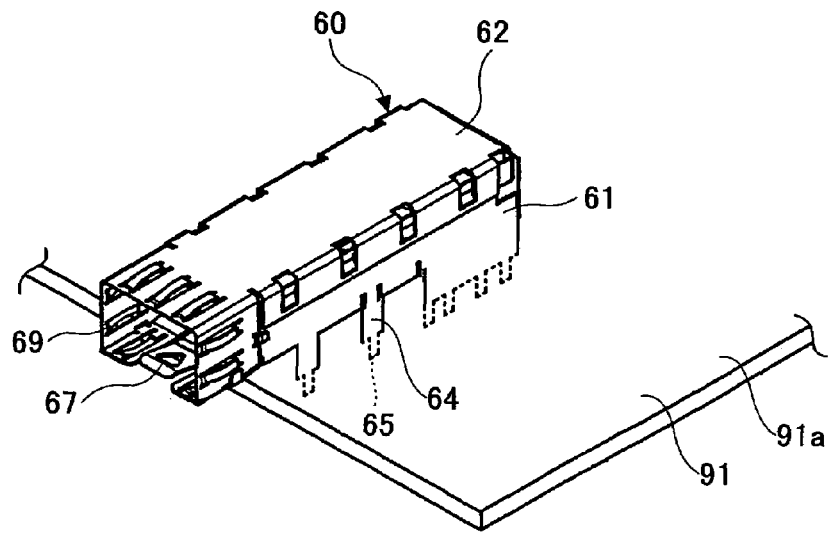
FIGS. 7A-7C are diagrams showing an optical module cage mounting structure according to Embodiment 1 of the present invention.
Figure 7B:
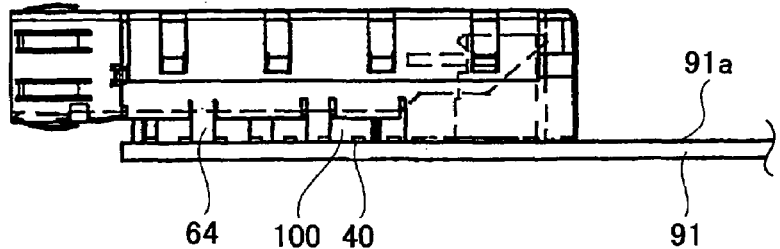
Figure 7C:
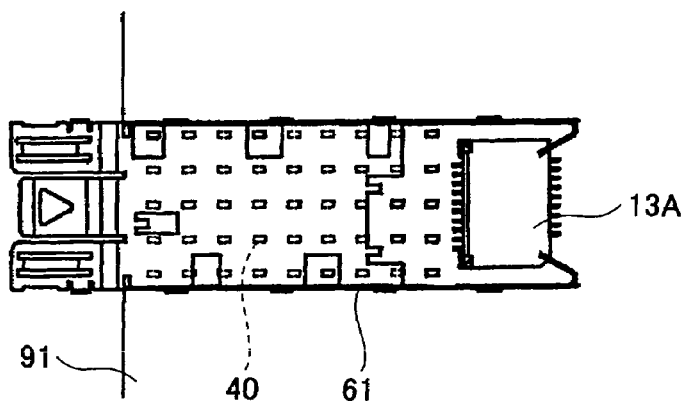

FIGS. 7A-7C illustrate an optical module cage mounting structure according to Embodiment 1 of the present invention.

Figure 8A:
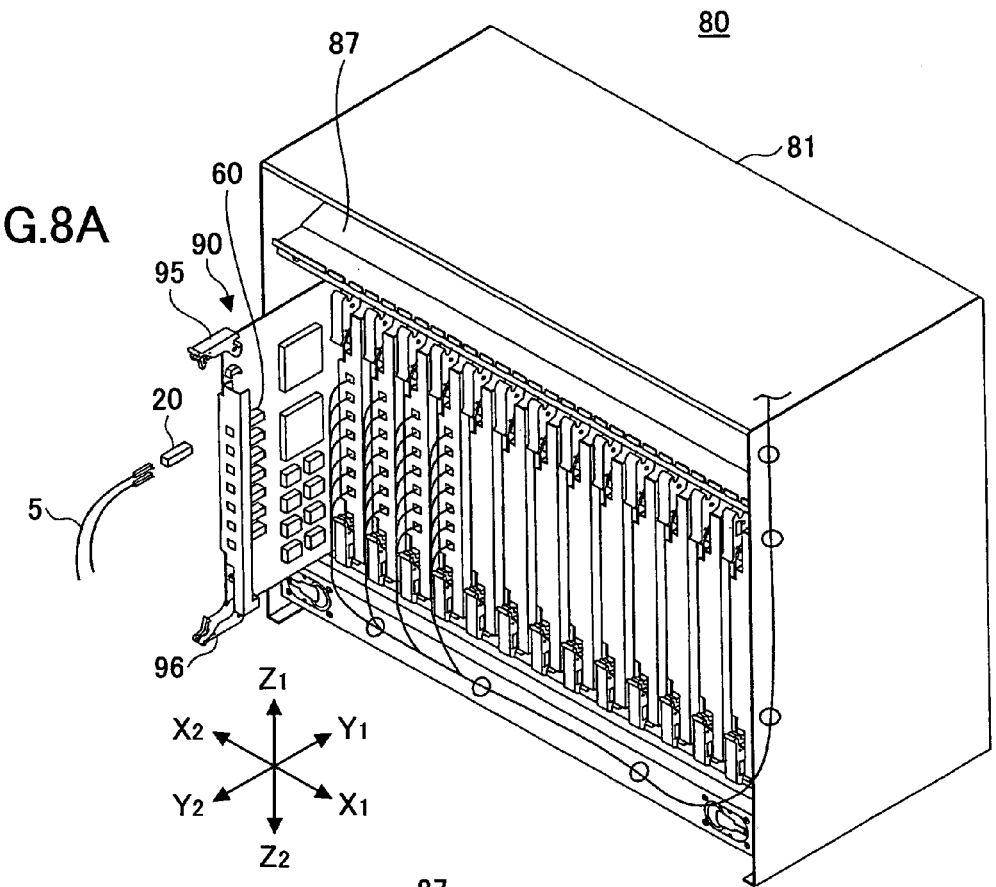
FIGS. 8A and 8B are diagrams showing a communication device employing the optical module cage mounting structure of FIGS. 7A-7C.
Figure 8B:
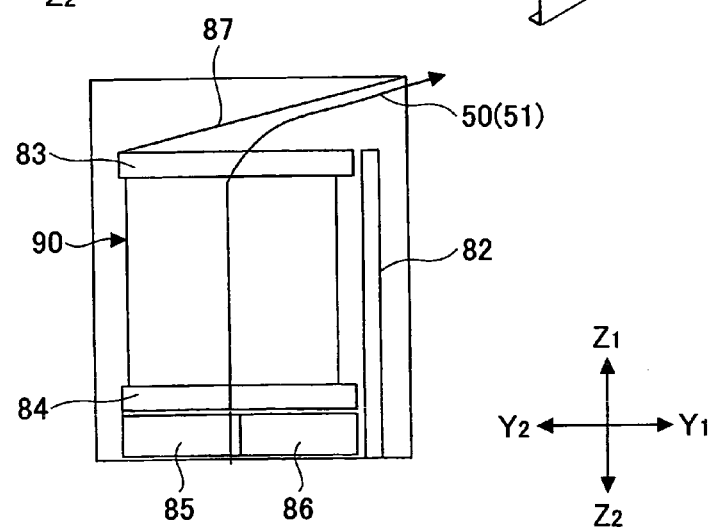

FIGS. 8A and 8B illustrate a communication device 80 employing the optical module cage mounting structure of FIGS. 7A-7C. The line X1-X2, the line Y1-Y2, and the line Z1-Z2 indicate the width direction, the depth direction, and the height direction, respectively.

The communication device 80 comprises a device casing 81 in which plural plug-in units 90 are aligned in the X1-X2 direction and vertically mounted. An optical fiber 5 is connected from the outside to one of the plug-in units 90. The device casing 81 comprises a back board at the rear side, guide rails 83 and 84 at the upper and lower sides, respectively, fans 85 and 86 for forced-air cooling at the lower side, and a shield plate 87 at the upper side.

Figure 9:
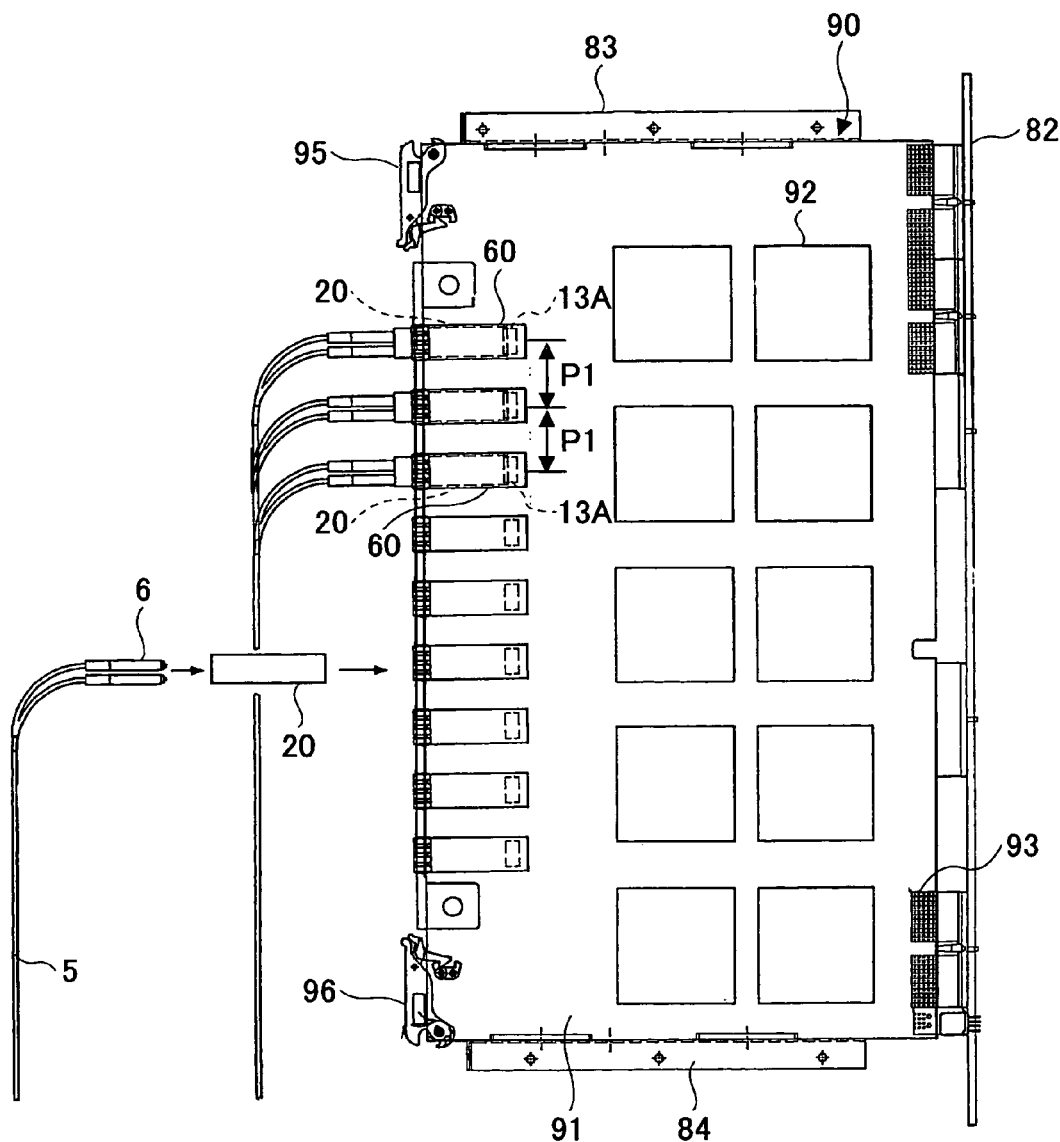
FIG. 9 is a diagram showing a plug-in unit of FIGS. 8A and 8B.

Referring to FIGS. 8A and 9, in each plug-in unit 90, electronic components 92 are mounted on a printed circuit board 91. Also, plural optical module cages 60 and plural connectors 13A are aligned and mounted along a Y2-side edge. Further, a bracket 94 is attached to the Y2-side edge, and attaching levers 95 and 96 are attached to the Z1 side and the Z2 side, respectively, of the Y2-side edge.

FIG. 10E illustrates the optical module cage 60. The optical module cage 60 is different from the related-art optical module cage 30 of FIG. 3A in that standoff sections 64 are provided. The optical module cage 60 is formed by coupling a lower-half cage 61 shown in FIGS. 10C and 10D to an upper-half cage 62 shown in FIGS. 10A and 10B. The lower-half cage 61 and the upper-half cage 62 are metal plates bent into specific shapes.

The optical module cage 60 comprises a cage body 63, the standoff sections 64, leads 65, and a lock piece 67 with a lock hole 66.

Figure 4:
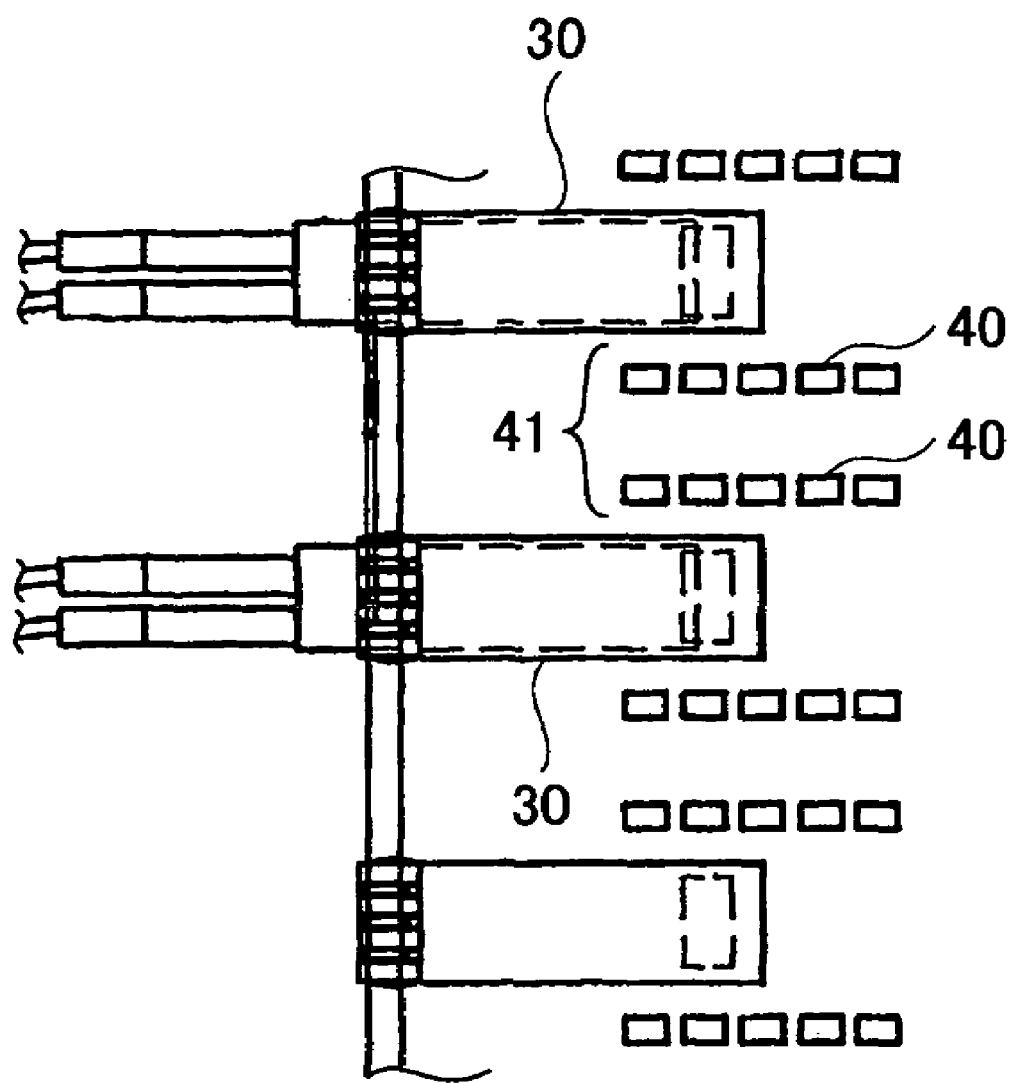
FIG. 4 is a diagram for illustrating the first problem of the related-art optical module cage.

The cage body 63 is formed in a box shape with a size corresponding to the optical module 20 of FIG. 4, and includes a bottom plate section 68 and an insertion slot 69 at an end thereof. The lock piece 67 is formed to project outward beyond the insertion slot 69 side of the bottom plate section 68.

The standoff sections 64 are provided on both sides of the bottom plate section 68. The standoff sections 64 are formed to project downward by a distance a (1.5 mm or greater) from positions corresponding to the positions of the leads 32 of the related-art optical module cage 30 of FIG. 3A. The leads 65 are formed to project downward from the lower ends of the corresponding standoff sections 64.

Figure 1:
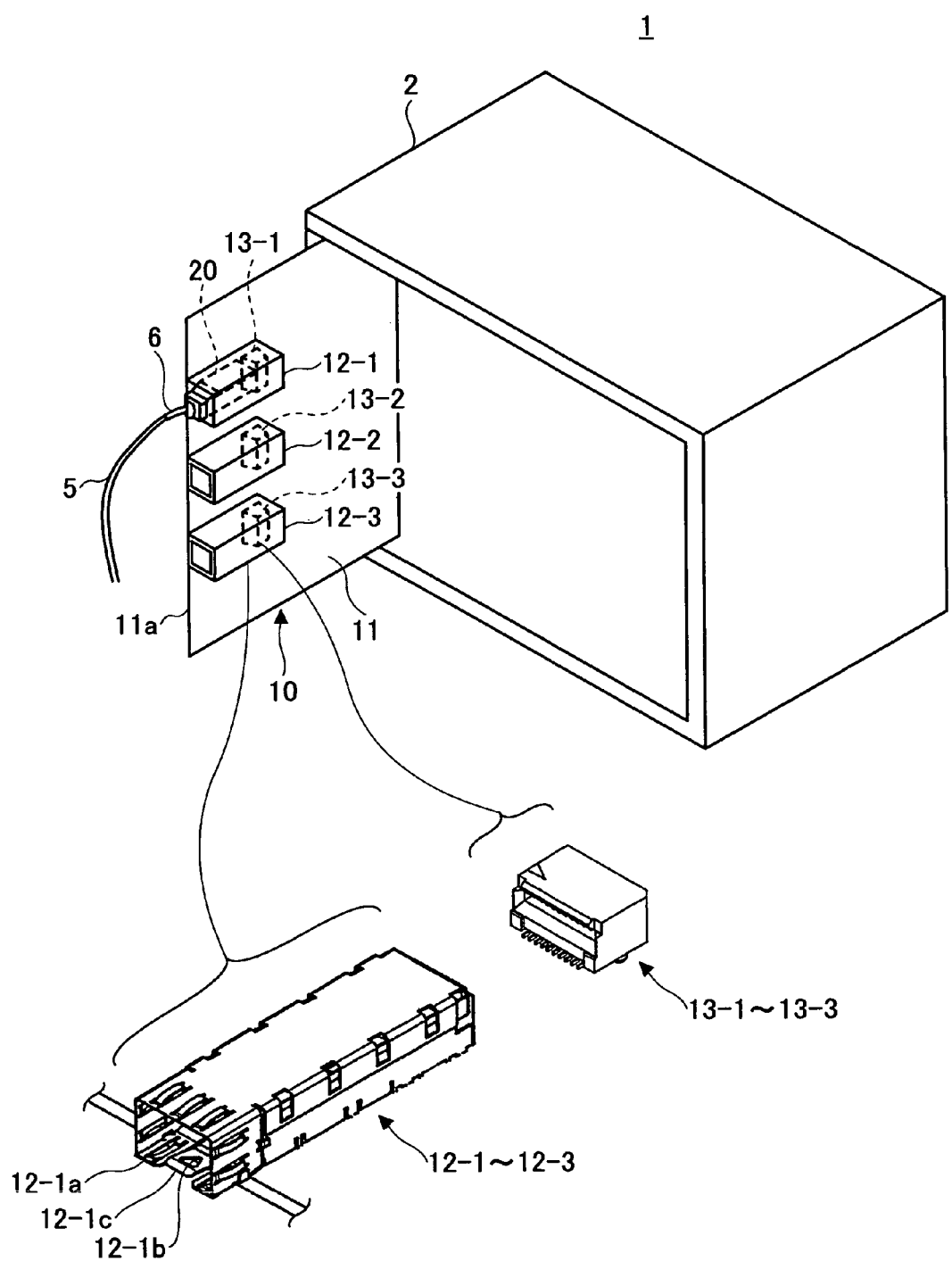
FIG. 1 is a schematic diagram showing a communication device.
Figure 2A:
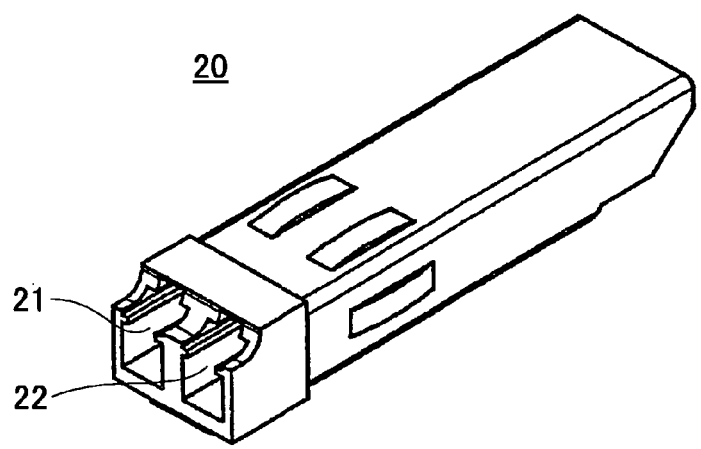
FIGS. 2A-2E are diagrams showing an optical module.
Figure 2B:
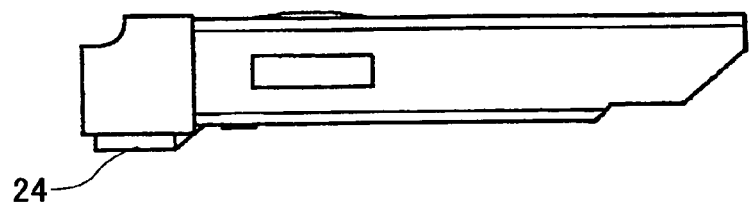
Figure 2C:
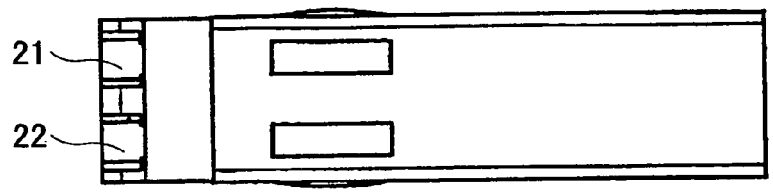
Figure 2D:
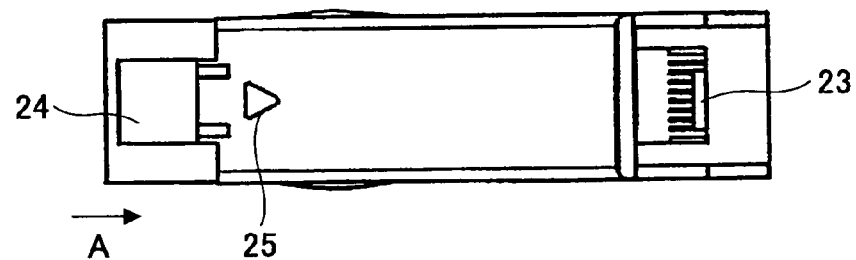
Figure 2E:
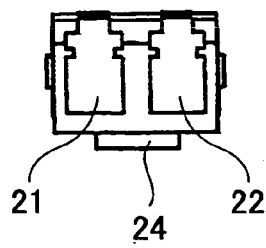

In FIGS. 7A-7C, the optical module cage 60 is mounted on the printed circuit board 91. The optical module cage 60 is mounted on the printed circuit board 91 with the leads 65 inserted in through holes of the printed circuit board 91, the cage body 63 spaced apart from a face 91a of the printed circuit board 91 by the distance corresponding to the height of the standoff section 64 (i.e., the distance a), and the Y1-side portion covering the connector 13A. The connector 13A corresponds to the connector 13 of FIG. 1, and has a height greater than the connector 13 by the height of the standoff section 64.

A space 100 with a height corresponding to the distance a is formed between the bottom plate section 68 of the cage body 63 and the face 91a of the printed circuit board 91. The space 100 is an area for mounting electronic components, an area for air passage, an area for a radiating structure section, and/or an area for accommodating a heat sink as described below.

Electronic components 40 shown in FIGS. 7B and 7C have thickness of about 0.5 mm, and therefore are easily accommodated in the space 100. Accordingly, as shown in FIGS. 7B and 7C, the electronic components 40 are mounted in the area where the optical module cage 60 is mounted, and are covered with the optical module cage 60.

There is therefore no need to have an area for mounting the electronic components 40 outside the area where the optical module cages 60 are mounted, which allows, as shown in FIG. 9, arranging the optical module cages 60 at pitches P1 smaller than the pitches of the related art configuration and increasing the number of the optical module cages 60. Accordingly, the number of the mounted optical module cages 60 is increased compared to the related art configuration.

That is, the maximum number of the optical modules 20 per plug-in unit 90 is increased compared to the related-art configuration, so that the maximum number of lines per plug-in unit 90 is increased compared to the related-art configuration. The communication device 80 can thus easily adapt to capacity increases in backbone networks compared to the related-art devices.

In FIG. 9, the optical modules 20 are attached to the three uppermost optical module cages 60, and the plugs 6 provided at ends of the optical fiber 5 are connected to the optical modules 20.

Figure 11A:
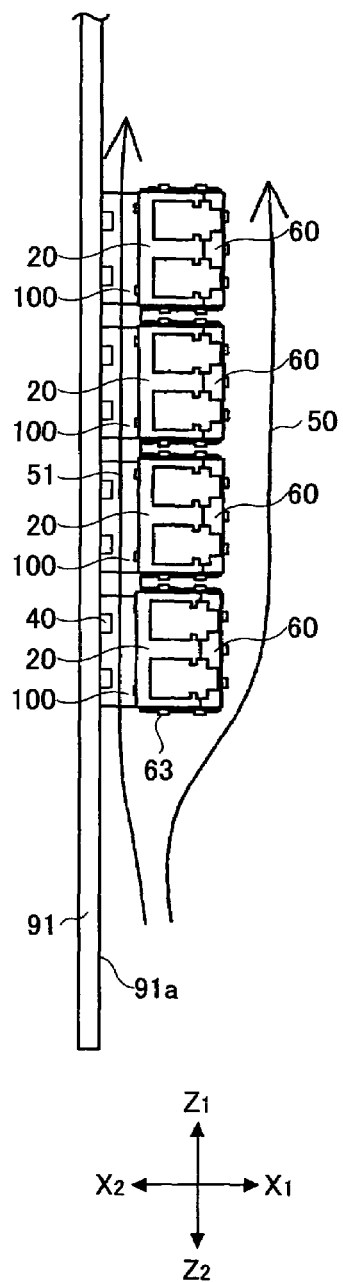
FIGS. 11A and 11B are diagrams showing optical modules being forced-air cooled in a plug-in unit mounted in a device casing.
Figure 11B:
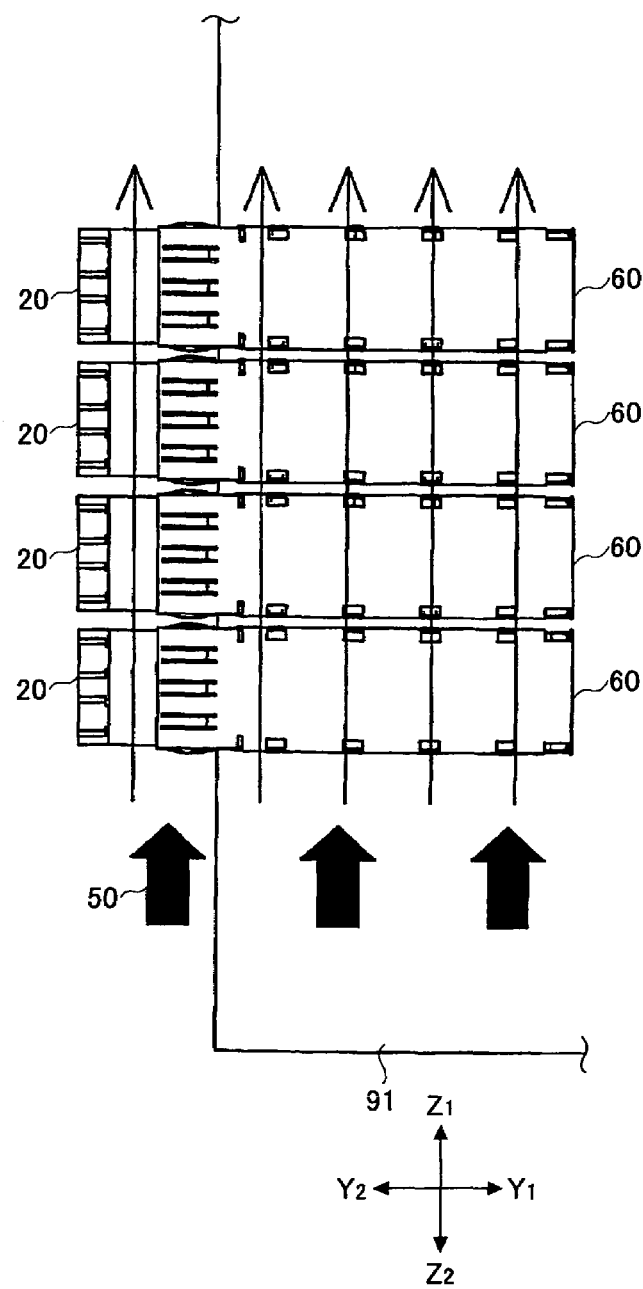

FIGS. 11A and 11B illustrate the optical modules 20 being forced-air cooled in the plug-in unit 90 mounted in the device casing 81. Air from the fans 85 and 86 of FIG. 8B passes through not only the upper side of the optical module cages 60 as indicated by an arrow 50 but also the space 100 between the cage bodies 63 and the printed circuit board 91 as indicated by an arrow 51 while directly hitting the bottom plate sections 68. The air reaches the optical module cages 60 disposed in positions further from the fans 85 and 86, i.e., the optical module cages 60 disposed at the Z1 side, so that especially the optical modules 20 attached to the optical module cages 60 disposed at the Z1 side are more effectively cooled compared to the related-art configuration.

Since the bottom plate section 68 of each cage body 63 is spaced apart from the face 91a of the printed circuit board 91, even if the entire optical module cage 60 is located on the printed circuit board 91, the lock piece 67 is prevented from interfering with the printed circuit board 91. Also, the lock release knob 24 of the optical module 20 attached to the optical module cage 60 is prevented from interfering with the printed circuit board 91.

Embodiment 2

Figure 12A:
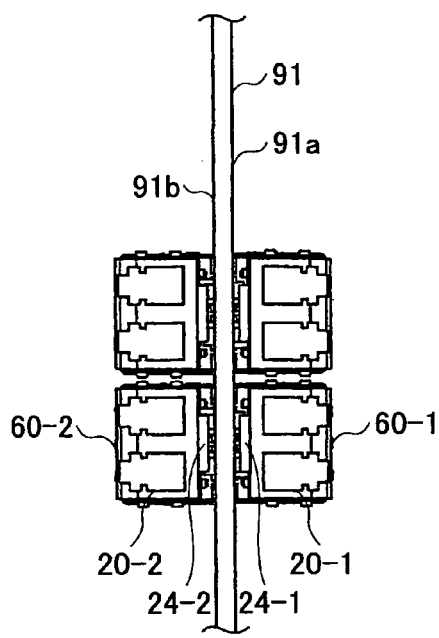
FIGS. 12A-12C are diagrams showing an optical module cage mounting structure according to Embodiment 2 of the present invention.
Figure 12B:
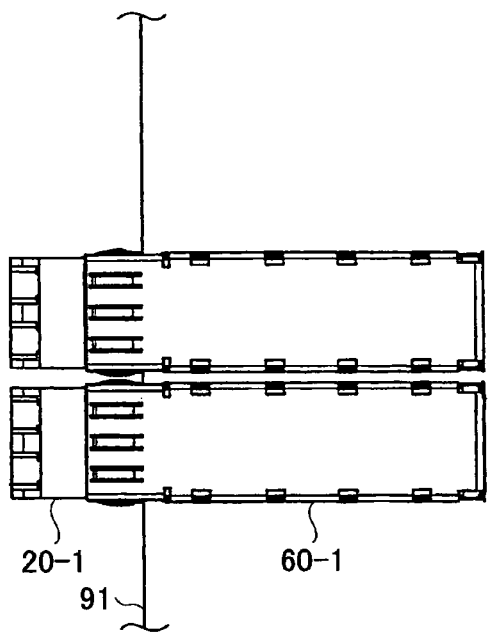
Figure 12C:
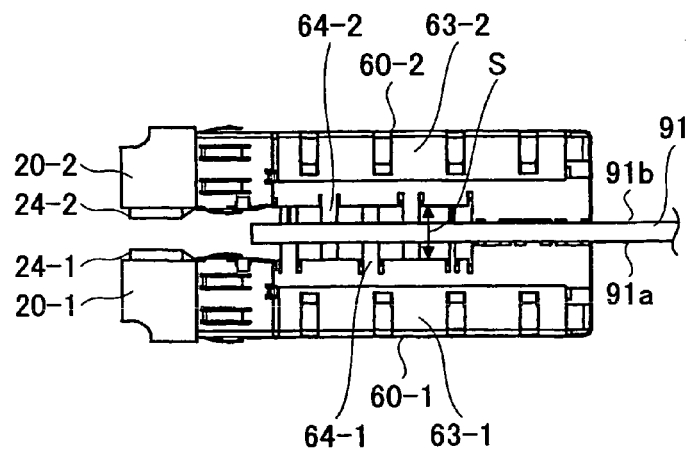

FIGS. 12A-12C show an optical module cage mounting structure according to Embodiment 2 of the present invention.

In this embodiment, optical module cages 60-1 and 60-2 are mounted in an opposing relationship on the opposite faces 91a and 91b, respectively, of the printed circuit board 91. The optical module cages 60-1 and 60-2 are mounted on the printed circuit board 91 such that cage bodies 63-1 and 63-2 are spaced apart from the faces 91a and 91b, respectively, of the printed circuit board 91 by the distance corresponding to the height of standoff sections 64.

Accordingly, as shown in FIG. 12C, a distance S between the cage body 63-1 of the optical module cage 60-1 and the cage body 63-2 of the opposing optical module cage 60-2 corresponds to the sum of the thickness of the printed circuit board 91 and twice the height of the standoff section 64. That is, the distance S between the cage body 63-1 and the cage body 63-2 is greater by the distance corresponding to twice of the height of the standoff section 64 compared to the related-art configuration.

With this configuration, even if the thickness of the printed circuit board 91 is 3 mm or less, a lock release knob 24-1 for the optical module cage 60-1 and a lock release knob 24-2 for the optical module cage 60-2 are prevented from interfering with each other. Therefore, even if the thickness of the printed circuit board is 3 mm or less, the optical module cages 60-1 and 60-2 can be mounted in an opposing relationship on the opposite faces 91a and 91b, respectively, of the printed circuit board 91.

Accordingly, the maximum number of the optical modules 20 per plug-in unit 90 can be increased using a printed circuit board 91 with a thickness of 3 mm or less. The communication device 80 can thus more easily adapt to capacity increases in backbone networks.

Embodiment 3

Figure 13:
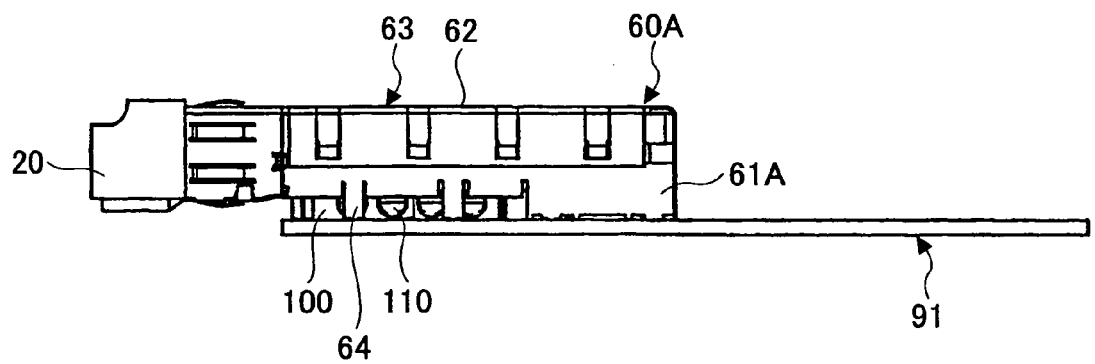
FIG. 13 is a diagram showing an optical module cage mounting structure according to Embodiment 3 of the present invention.
Figure 14A:
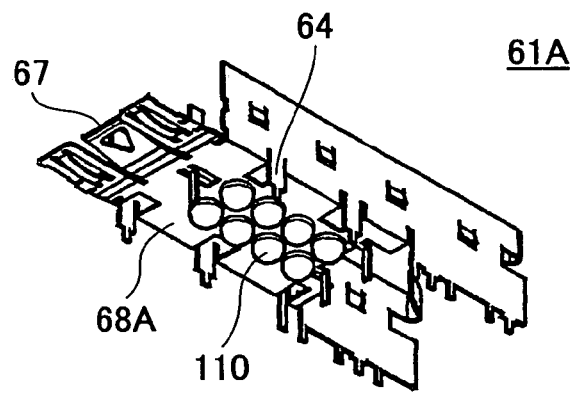
FIGS. 14A-14D are diagrams showing a lower-half cage of an optical module cage of FIG. 13.
Figure 14B:
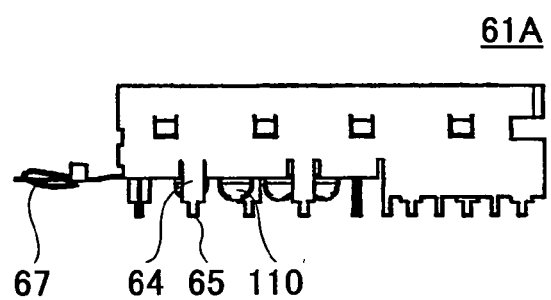
Figure 14C:
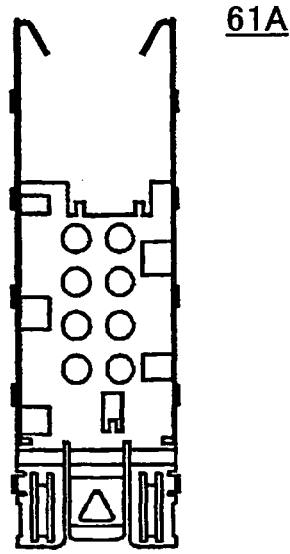
Figure 14D:
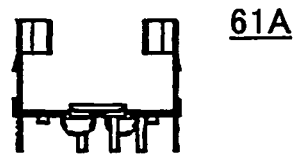

FIG. 13 shows an optical module cage mounting structure according to Embodiment 3 of the present invention.

In this embodiment, an optical module cage 60A is mounted on the printed circuit board 91. The optical module cage 60A is formed by coupling an upper-half cage 62 to a lower-half cage 61A shown in FIGS. 14A-14D.

The lower-half cage 61A includes, in addition to standoff sections 64, a bottom plate section 68A. The bottom plate section 68A includes plural hemispheric boss sections 110 aligned on a flat plate and projecting downward. The area where the boss sections 110 are aligned forms a radiating structure section.

As shown in FIG. 13, the optical module cage 60A is mounted such that a cage body 63 is spaced apart from the printed circuit board 91 by the distance corresponding to the height of the standoff section 64. The boss sections 110 are projecting into space 100 to increase the surface area (radiating area) of the bottom plate section 68A. The optical module 20 is attached to the optical module cage 60A.

With this configuration, compared to a flat bottom plate section as shown in FIG. 10D, air passing through the space 100 more effectively transfers heat from the bottom plate section 68A. Accordingly, heat of the optical module 20 is more effectively transferred through the bottom plate section 68A.

Embodiment 4

Figure 15:
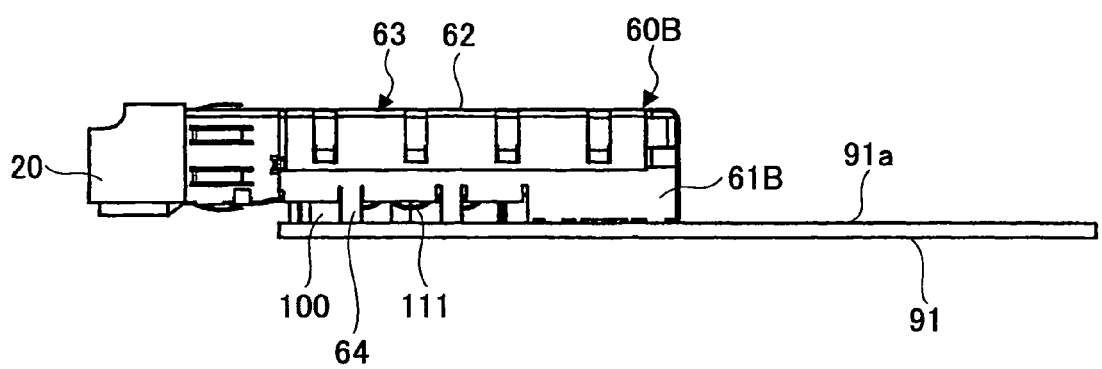
FIG. 15 is a diagram showing an optical module cage mounting structure according to Embodiment 4 of the present invention.
Figure 16A:
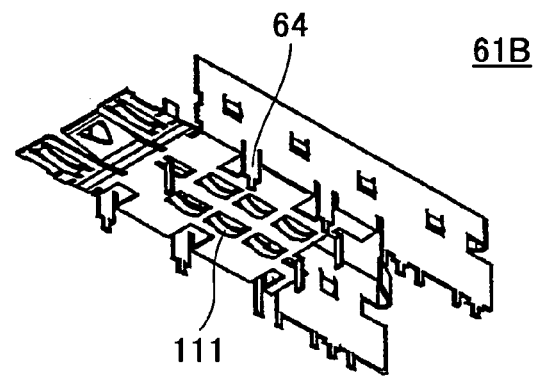
FIGS. 16A-16D are diagrams showing a lower-half cage of an optical module cage of FIG. 15.
Figure 16B:
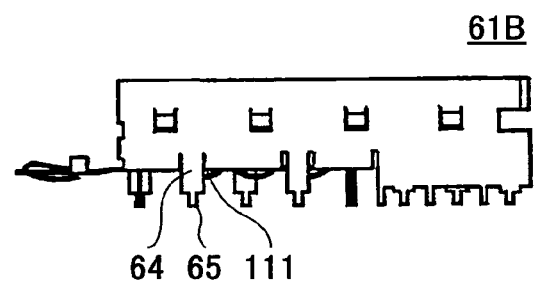
Figure 16C:
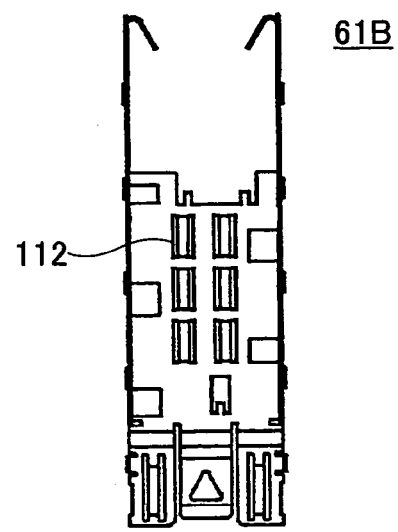
Figure 16D:
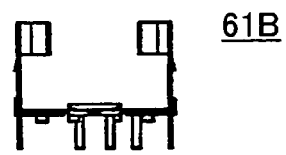

FIG. 15 shows an optical module cage mounting structure according to Embodiment 4 of the present invention.

In this embodiment, an optical module cage 60B is mounted on the printed circuit board 91. The optical module cage 60B is formed by coupling an upper-half cage 62 to a lower-half cage 61B shown in FIGS. 16A-16D.

The lower-half cage 61B includes, in addition to standoff sections 64, plural arcuate bridge sections 111. The lower-half cage 61B is different from the lower-half cage 61A of FIGS. 14A-14D in including the bridge sections 111 in place of the boss sections 110. Each bridge section 111 is formed by making a pair of parallel cuts in a flat plate and pressing downward the area between the cuts. The area where the bridge sections 111 are aligned forms a radiating structure section. An opening 112 is formed at the back side of each bridge section 111.

As shown in FIG. 15, the optical module cage 60B is mounted such that a cage body 63 is spaced apart from the printed circuit board 91 by the distance corresponding to the height of the standoff section 64. The bridge sections 111 are projecting into space 100. The optical module 20 is attached to the optical module cage 60B. A part of the bottom plate of the optical module 20 is exposed through the openings 112.

The air passing through the space 100 hits both sides of the bridge sections 111 and also hits directly the part of the optical module 20 exposed through the openings 112. Heat of the optical module 20 attached to the optical module cage 60B is thus effectively transferred.

Embodiment 5

Figure 17:
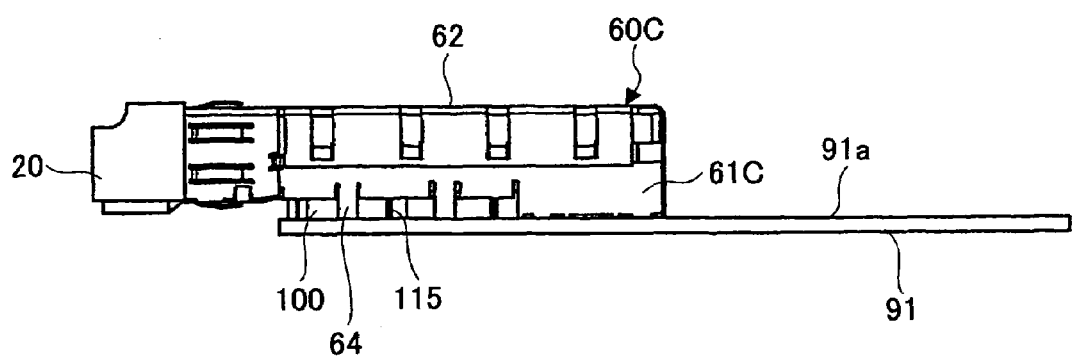
FIG. 17 is a diagram showing an optical module cage mounting structure according to Embodiment 5 of the present invention.
Figure 18A:
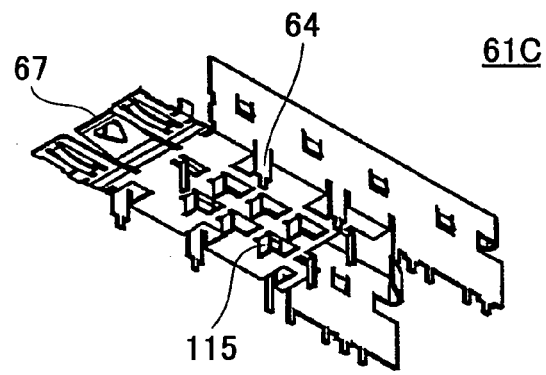
FIGS. 18A-18D are diagrams showing a lower-half cage of an optical module cage of FIG. 17.
Figure 18B:
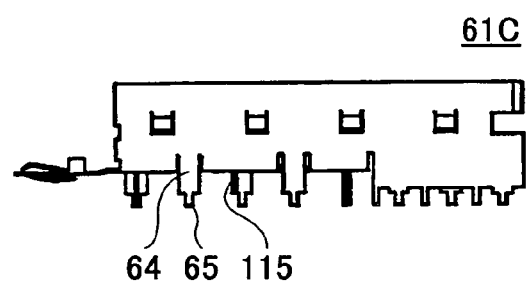
Figure 18C:
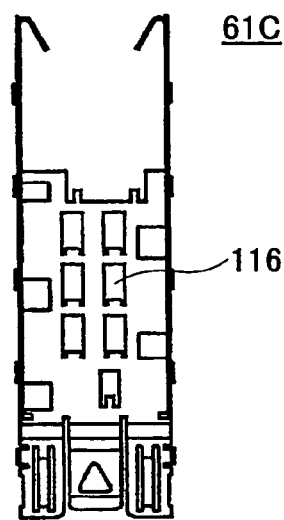
Figure 18D:
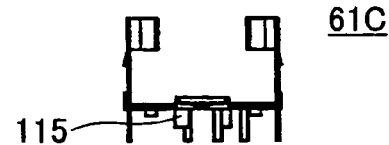

FIG. 17 shows an optical module cage mounting structure according to Embodiment 5 of the present invention.

In this embodiment, an optical module cage 60C is mounted on the printed circuit board 91. The optical module cage 60C is formed by coupling an upper-half cage 62 to a lower-half cage 61B shown in FIGS. 18A-18D.

The lower-half cage 61C includes, in addition to standoff sections 64, plural cut and bent pieces 115. The lower-half cage 61C is different from the lower-half cage 61B of FIGS. 16A-16D in including the cut and bent pieces 115 in place of the bridge sections 111. The area where the cut and bent pieces 115 are aligned forms a radiating structure section. An opening 116 is formed adjacent to each cut and bent piece 115.

The air passing through space 100 hits both sides of the cut and bent pieces 115 and also hits directly a part of the optical module 20 exposed through the openings 116. Heat of the optical module 20 attached to the optical module cage 60C is thus effectively transferred.

Embodiment 6

Figure 19A:
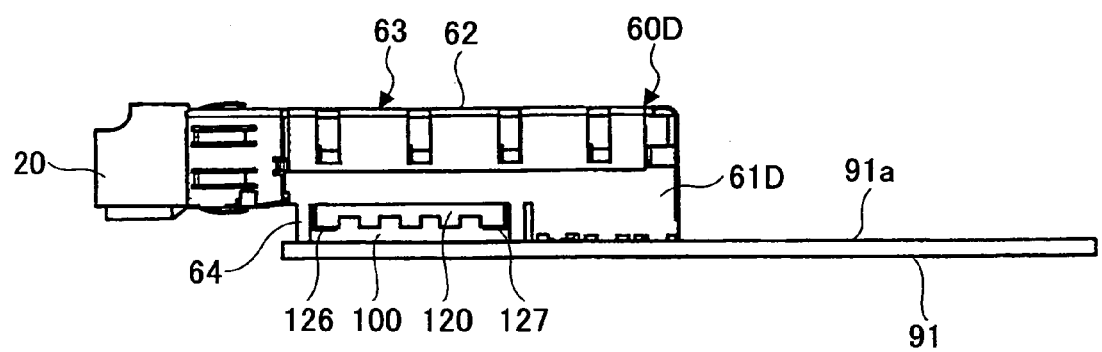
FIGS. 19A and 19B are diagrams showing an optical module cage mounting structure according to Embodiment 6 of the present invention.
Figure 19B:
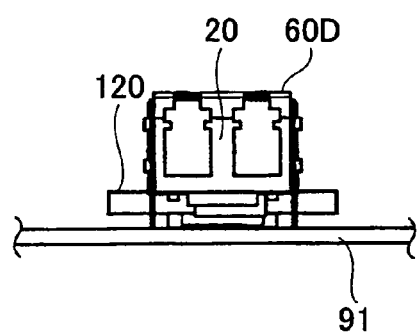

FIGS. 19A and 19B show an optical module cage mounting structure according to Embodiment 6 of the present invention.

In this embodiment, an optical module cage 60D is mounted on the printed circuit board 91 while a heat sink 120 shown in FIGS. 21A-21D is attached to the lower face of a cage body 63. The optical module cage 60D is formed by coupling an upper-half cage 62 to a lower-half cage 61D shown in FIGS. 20A-20D.

Referring to FIGS. 20A-20D, the lower-half cage 61D includes, in addition to standoff sections 64, an opening 125 and two rail sections 126 and 127. The standoff sections 64 are spaced apart from each other in the longitudinal direction of the optical module cage 60D. The opening 125 is formed at the center of a bottom plate section 68D and has a rectangular shape with a size corresponding to a projecting section 121 of the heat sink 120. Each of the rail sections 126 and 127 is formed in an L-shape in cross section by cutting and bending a part of the bottom plate section 68D and is elongated in the direction perpendicular to the longitudinal direction of the optical module cage 60D. The rail sections 126 and 127 are located to correspond to the size of the heat sink 120 with horizontal sections of the rail sections 126 and 127 facing each other.

Referring to FIGS. 21A-21D, the heat sink 120 is a generally square shaped aluminum plate and comprises the projecting section 121 on the upper face thereof and groove sections 122 and rib sections 123 on the lower face 35 thereof. A beveled face 124 is formed around the projecting section 121.

As shown in FIGS. 19A and 19B, the optical module cage 60D is mounted such that a cage body 63 is spaced apart from the printed circuit board 91 by the distance corresponding to the height of the standoff section 64. The heat sink 120 attached to the lower face of the cage body 63 is accommodated in space 100. The groove sections 122 and the rib sections 123 formed on the lower face of the heat sink 120 extend in the width direction of the optical module cage 60D.

Figure 20A:
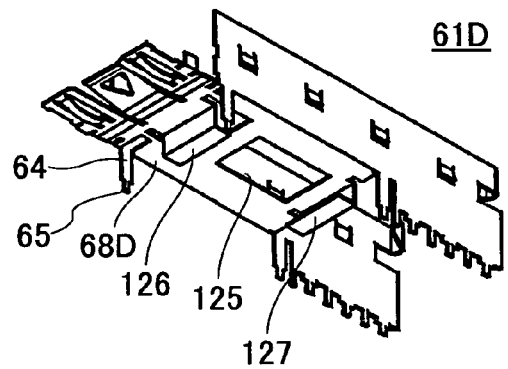
FIGS. 20A-20G are diagrams showing a lower-half cage of an optical module cage of FIGS. 19A and 19B.
Figure 20B:
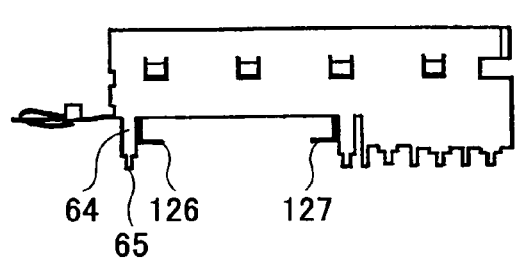
Figure 20C:
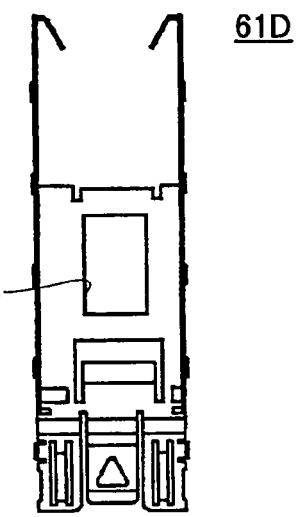
Figure 20D:
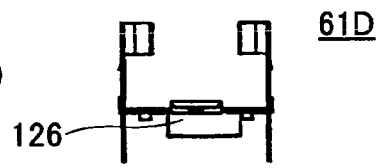
Figure 20E:
Figure 20F:
Figure 20G:
Figure 21A:
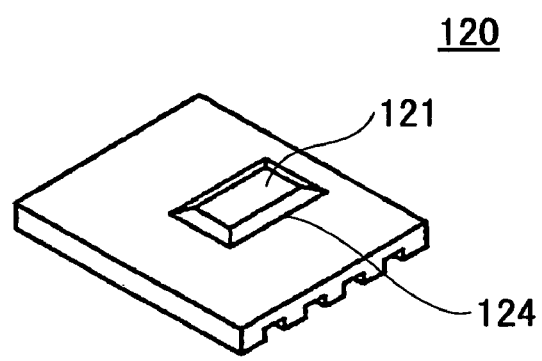
FIGS. 21A-21D are diagrams showing a heat sink of FIGS. 19A and 19B.
Figure 21B:
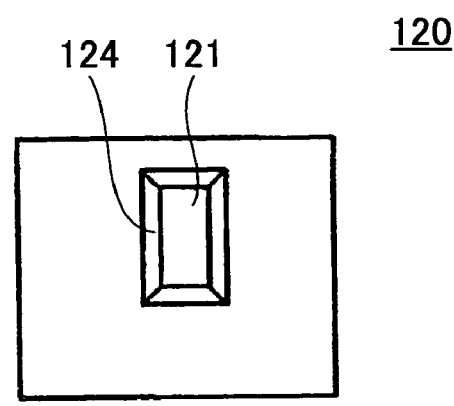
Figure 21C:
Figure 21D:
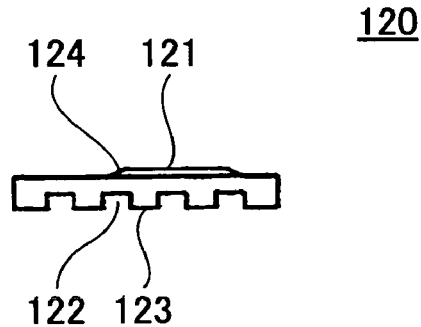

The heat sink 120 is attached by being inserted into the space 100 from the lateral side thereof in the width direction of the optical module cage 60D while being supported by the rail sections 126 and 127. When the heat sink 120 is being inserted with the rail sections 126 and 127 as guides, the projecting section 121 is slid onto the lower face of the bottom plate section 68D due to the presence of the beveled face 124, which causes the rail section 126 (127) to elastically bend as shown in FIG. 20F. When the heat sink 120 is further inserted, the projecting section 121 fits in the opening 125 and slightly projects from the upper face of the bottom plate section 68D of the cage body 63. The rail section 126 (127) returns to the original position as shown in FIG. 21G, so that the rail sections 126 and 127 elastically support and hold the heat sink 120 from opposite sides. The heat sink 120 may be attached before mounting the optical module cage 60D.

Upon insertion of the optical module 20 into the optical module cage 60D, the beveled face 124 enables the bottom face of the optical module 20 to slide smoothly onto the upper face of the projecting section 121. The upper face of the projecting section 121 is pressed with elastic force of the rail sections 126 and 127 to be in tight contact with the bottom face of the optical module 20 attached to the optical module cage 60D.

The air passing through the space 100 hits the heat sink 120, so that the heat of the optical module 20 is effectively transferred through the heat sink 120 then from the surface of the heat sink 120.

Embodiment 7

FIGS. 22A-22C show an optical module cage mounting structure according to Embodiment 7 of the present invention.

This optical module cage mounting structure is different from the optical module cage mounting structure shown in FIGS. 19A and 19B in that a single heat sink 120A is attached to four optical module cages 60D-1-60D-4.

Figure 23:
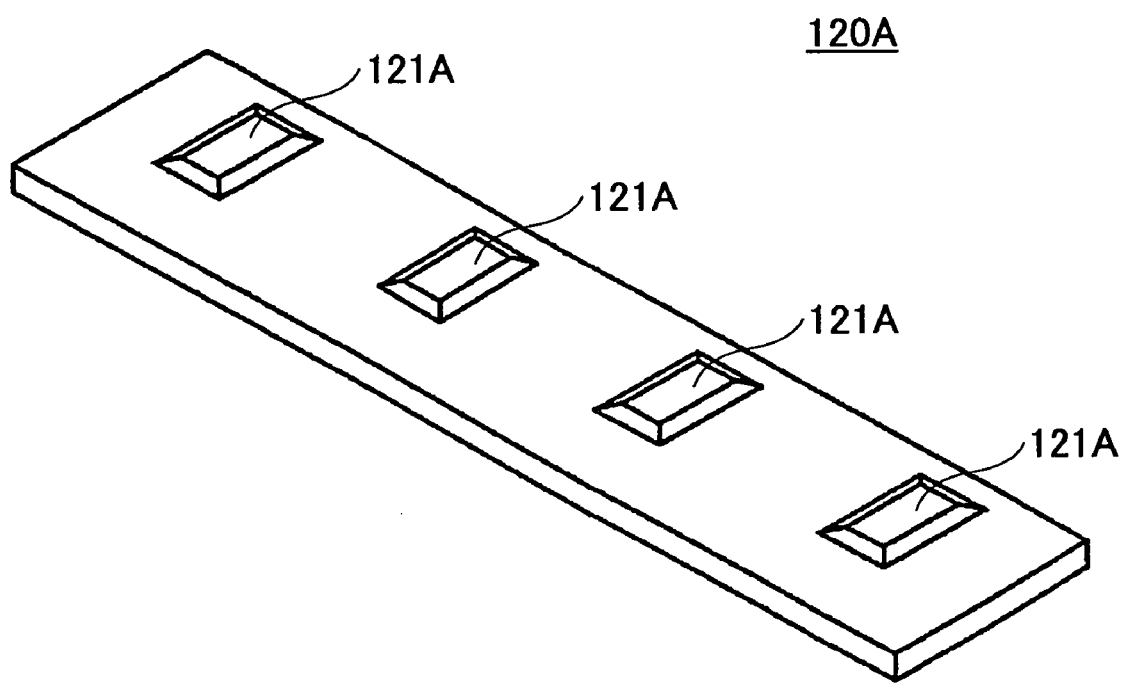
FIG. 23 is a perspective view showing a heat sink of FIGS. 22A-22C.

Referring to FIG. 23, the heat sink 120A is an elongated plate with four equally-spaced projecting sections 121A disposed thereon. The heat sink 120A extends across the four optical module cages 60D-1-60D-4.

With this configuration, since heat is transferred in the longitudinal direction of the heat sink 120A, even the optical module 20 attached to the optical module cage 60D-1 disposed downwind and conventionally not cooled efficiently can be efficiently cooled. The surface area of the heat sink 120A may be increased by providing projections or the like on the lower face of the heat sink 120A.

Embodiment 8

Figure 3A:
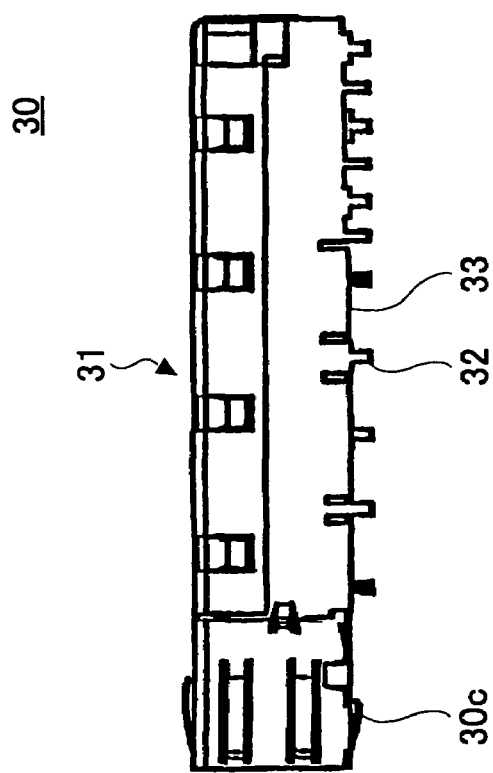
FIGS. 3A and 3B are diagrams showing a related-art optical module cage.
Figure 3B:
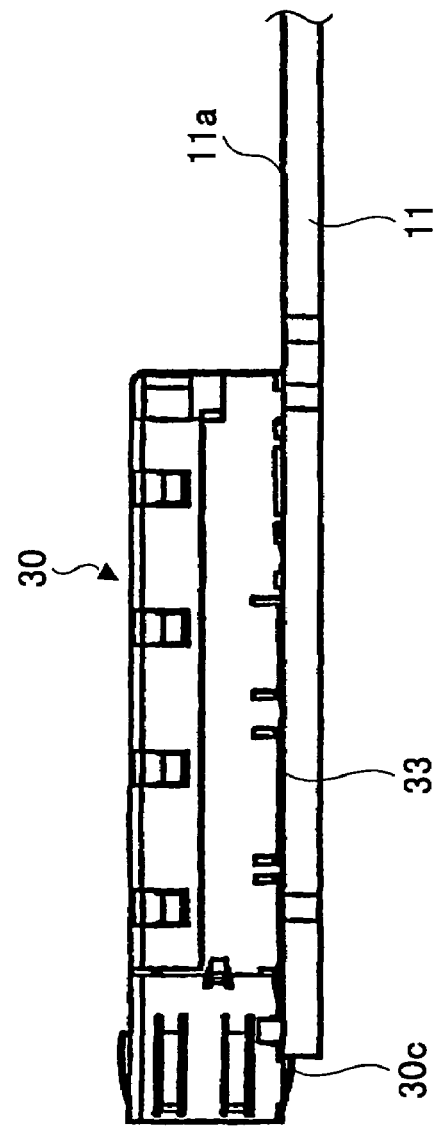
Figure 24A:
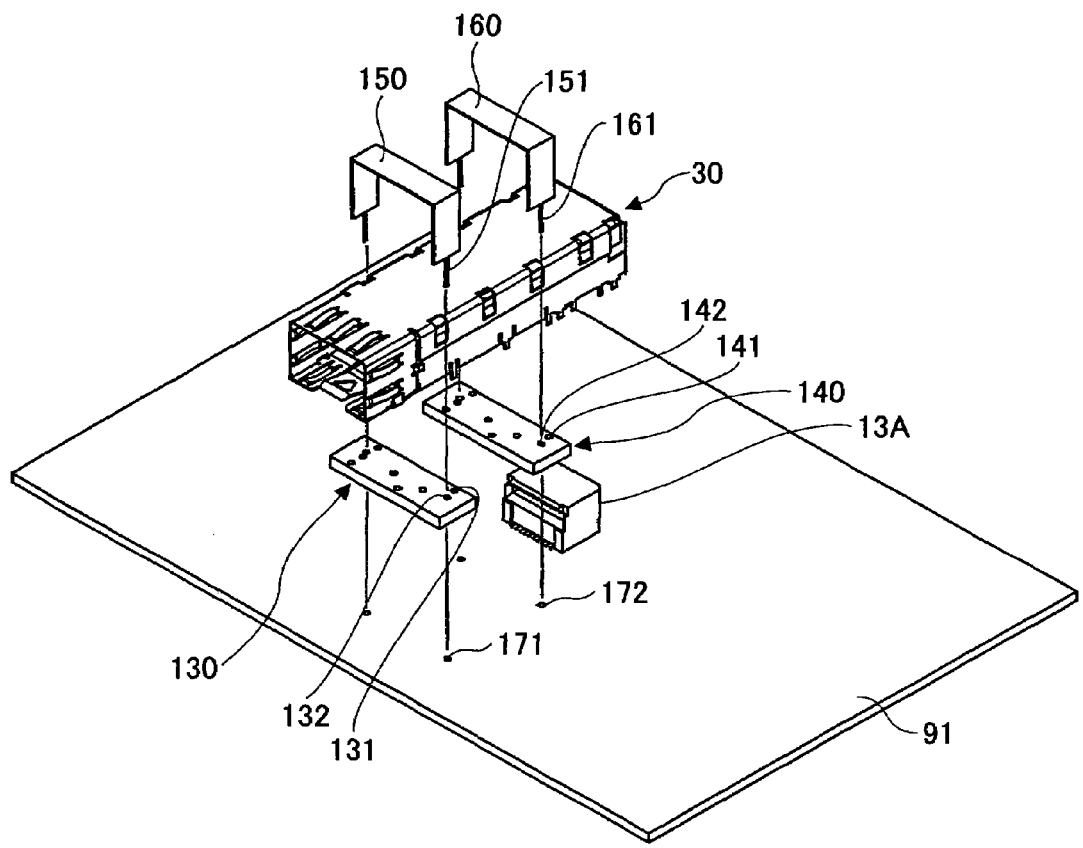
FIGS. 24A and 24B are diagrams showing an optical module cage mounting structure according to Embodiment 8 of the present invention.
Figure 24B:
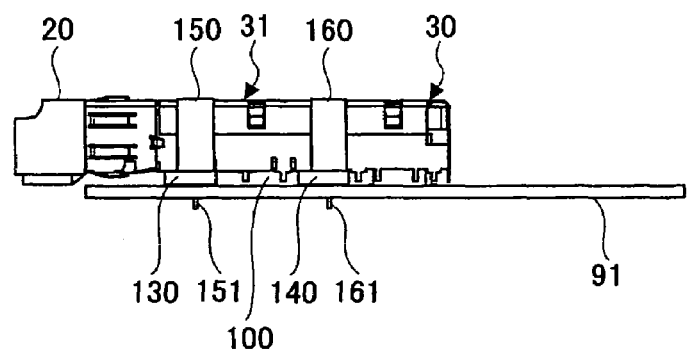

FIGS. 24A and 24B show an optical module cage mounting structure according to Embodiment 8 of the present invention. In the mounting structure of Embodiment 8 and mounting structures of Embodiments 9-12 described below, the related-art optical module cage 30 shown in FIG. 3A is mounted such that the cage body 31 is spaced apart from the printed circuit board 91 with use of spacers, etc.

Two spacers 130 and 140 are aligned and fixed on the printed circuit board 91. The spacers 130 and 140 have cage through holes 131 and 141 into which the leads 32 of the optical module cage 30 are inserted and bracket through holes 132 and 142 into which leads 151 and 161 of brackets 150 and 160 are inserted, respectively. The printed circuit board 91 also has bracket through holes 171 and 172 into which the leads 151 and 161 of the brackets 150 and 160 are inserted.

The spacers 130 and 140 are positioned such that the bracket through holes 132 and 142 are aligned with the bracket through holes 171 and 172, respectively, of the printed circuit board 91.

The optical module cage 30 extends across and is supported on the spacers 130 and 140 with the leads 32 inserted in the cage through holes 131 and 141. The cage body 31 is spaced apart from the printed circuit board 91 such that space 100 is formed between a bottom plate section of the cage body 31 and the printed circuit board 91.

The brackets 150 and 160 each have a generally inverted angular U shape. The length of each of the leads 151 and 161 is slightly greater than the sum of the thickness of the spacer 130 and the thickness of the printed circuit board 91. The bracket 150 extends across the optical module cage 30 such that the leads 151 extend through the bracket through holes 132 of the spacer 130 and the bracket through holes 171 of the printed circuit board 91. The ends of the leads 151 extending out of the bracket through holes 171 are soldered to the rear face of the printed circuit board 91. Similar to the bracket 150, the bracket 160 extends across the optical module cage 30 such that the leads 161 extend through the bracket through holes 142 of the spacer 140 and the bracket through holes 172 of the printed circuit board 91. The ends of the leads 161 extending out of the bracket through holes 172 are soldered to the rear face of the printed circuit board 91.

The optical module cage 30 is fixed and held at two points spaced apart in the longitudinal direction thereof by the brackets 150 and 160, and is spaced apart from the printed circuit board 91 by the distance corresponding to the height of the spacers 130 and 140. The optical module cage 30 is electrically connected to a ground pattern of the printed circuit board 91 via the brackets 150 and 160 made of metal. In order to ensure connection of the brackets 150 and 160 to the optical module cage 30, spring pieces may be formed by cutting and bending inward a part of the brackets 150 and 160.

In the case where the optical module cage 30 does not need to be at ground potential, the brackets 150 and 160 may be made of resin. Optionally, leg portions of the brackets 150 and 160 may be threaded into the printed circuit board 91.

Embodiment 9

Figure 25:
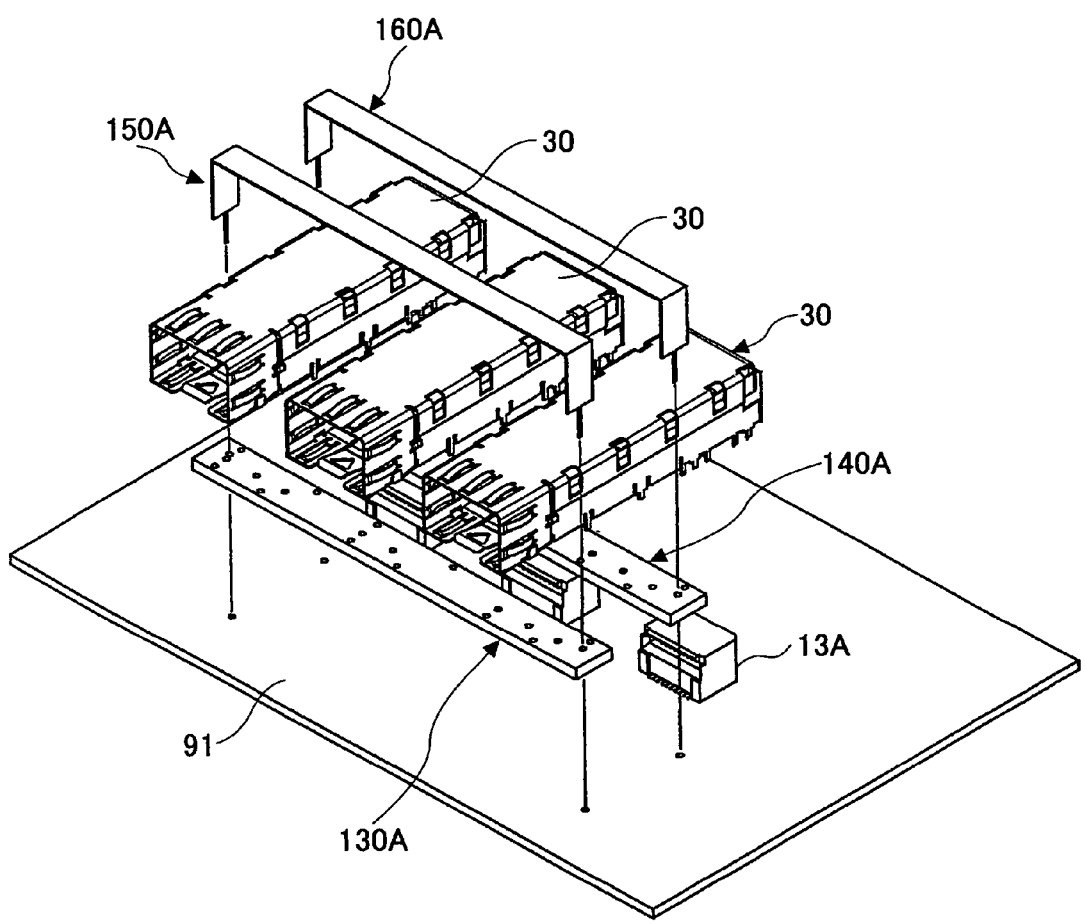
FIG. 25 is a diagram showing an optical module cage mounting structure according to Embodiment 9 of the present invention.

FIG. 25 shows an optical module cage mounting structure according to Embodiment 9 of the present invention.

The optical module mounting structure of this embodiment comprises spacers 130A and 140A each having a size corresponding to three aligned optical module cages 30 and brackets 150A and 160A each having a size corresponding to the three aligned optical module cages 30. The optical module cage mounting structure is configured such that the three aligned optical module cages 30 are supported on the spacers 130A and 140A and collectively fixed by the brackets 150A and 160A. The optical module cages 30 are electrically connected to the ground pattern of the printed circuit board 91 via the brackets 150A and 160A.

Embodiment 10

Figure 26A:
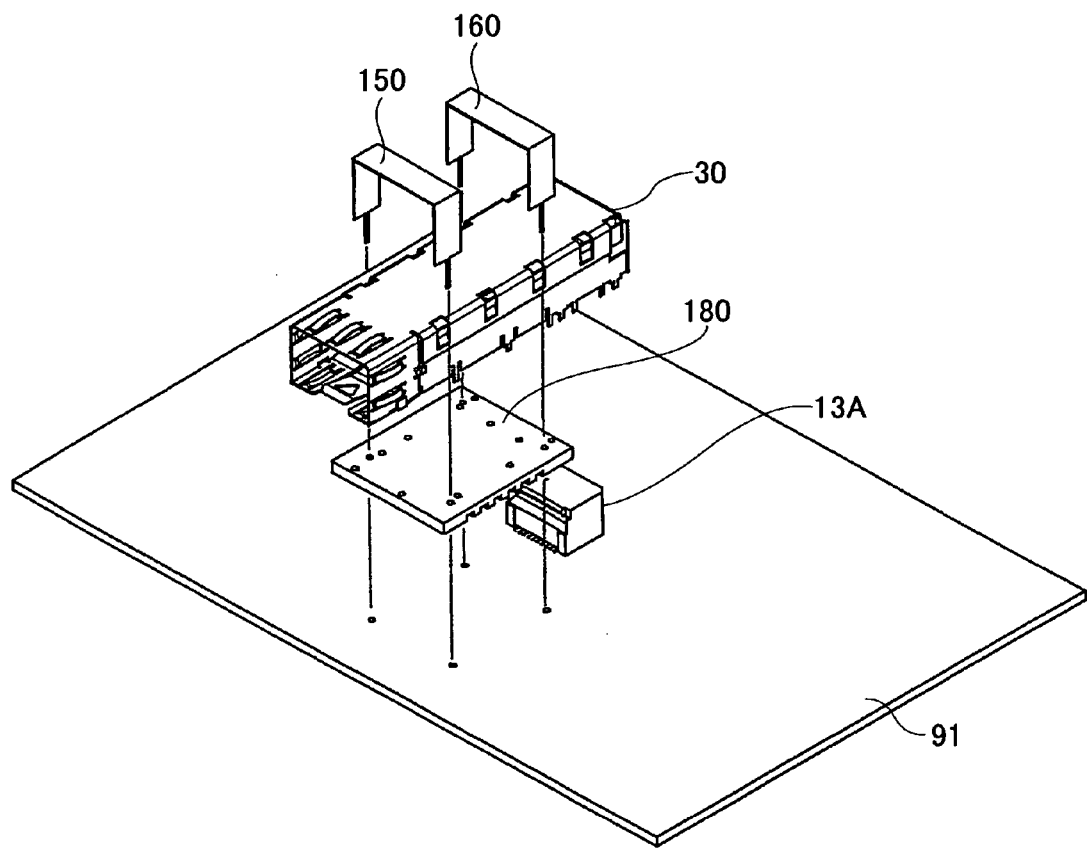
FIGS. 26A and 26B are diagrams showing an optical module cage mounting structure according to Embodiment 10 of the present invention.
Figure 26B:
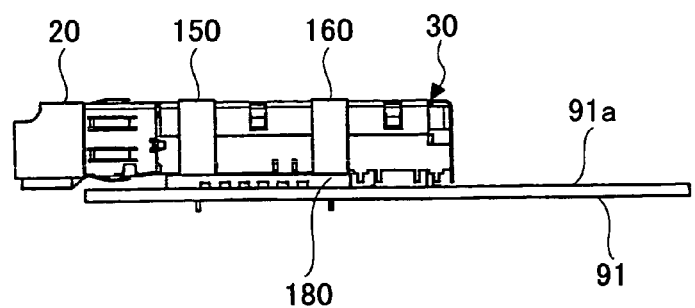

FIGS. 26A and 26B show an optical module cage mounting structure according to Embodiment 10 of the present invention.

In the optical module mounting structure of this embodiment, a heat sink 180 is used in place of the two spacers 130 and 140 shown in FIGS. 24A and 24B.

The optical module cage 30 is fixed on the heat sink 180 by the brackets 150 and 160, and is spaced apart from the face 91a of the printed circuit board 91 by the distance corresponding to the thickness of the heat sink 180.

The optical module 20 attached to the optical module cage 30 is efficiently cooled by the heat sink 180.

Embodiment 11

Figure 27:
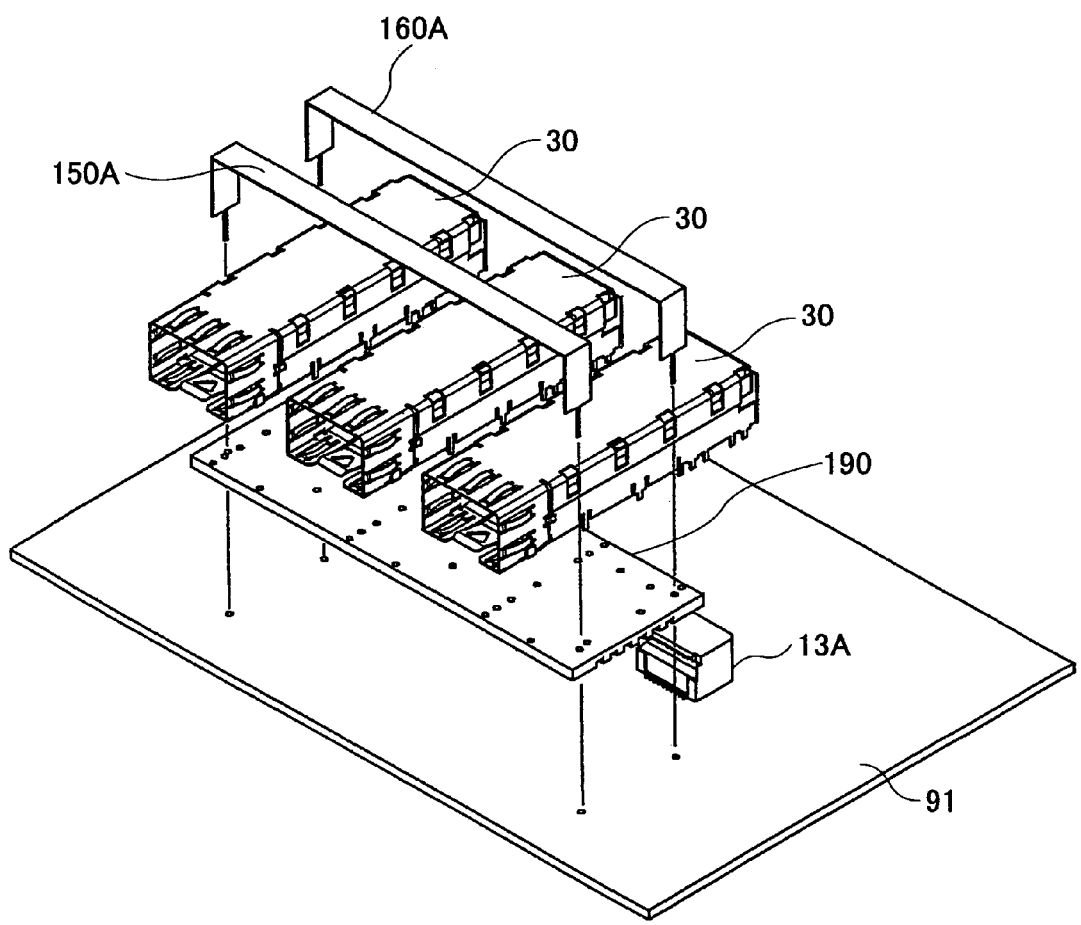
FIG. 27 is a diagram showing an optical module cage mounting structure according to Embodiment 11 of the present invention.

FIG. 27 shows an optical module cage mounting structure according to Embodiment 11 of the present invention.

In the optical module mounting structure of this embodiment, a heat sink 190 is used in place of the two spacers 130A and 140A shown in FIG. 25.

Three optical module cages 30 are fixed on the heat sink 190 by the brackets 150A and 160A, and are spaced apart from the face 91a of the printed circuit board 91 by the distance corresponding to the thickness of the heat sink 190.

Embodiment 12

Figure 28A:
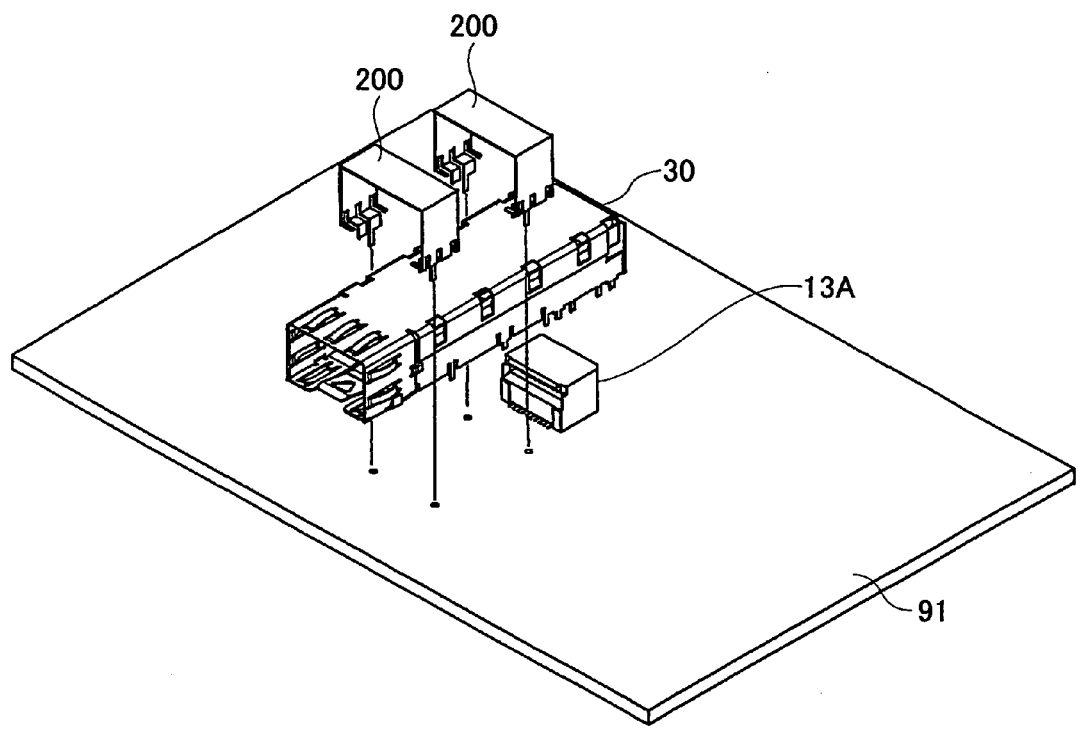
FIGS. 28A and 28B are diagrams showing an optical module cage mounting structure according to Embodiment 12 of the present invention.
Figure 28B:
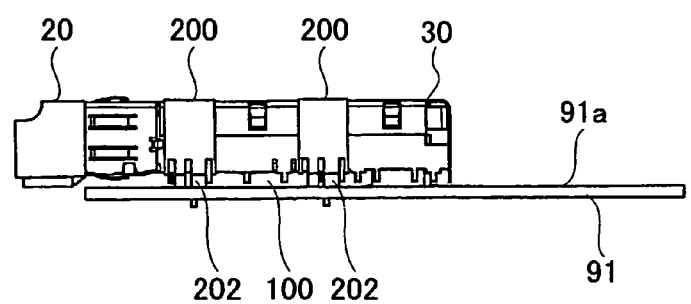

FIGS. 28A and 28B show an optical module cage mounting structure according to Embodiment 12 of the present invention.

Figure 29A:
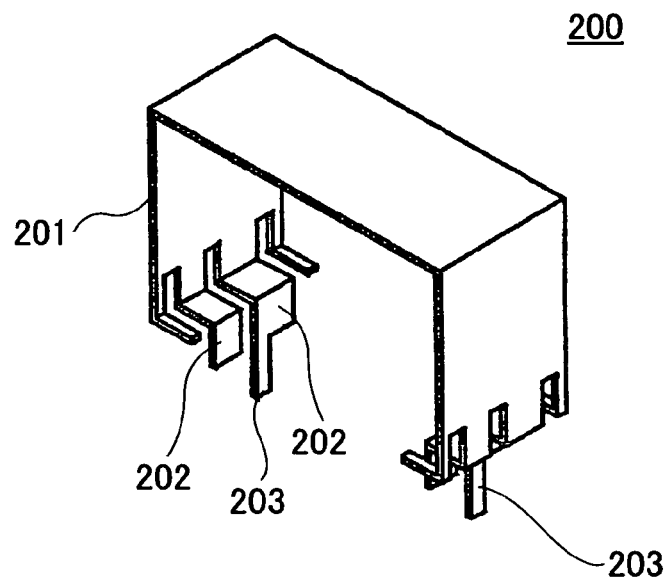
FIGS. 29A-29C are diagrams showing a holding member of FIGS. 28A and 28B.
Figure 29B:
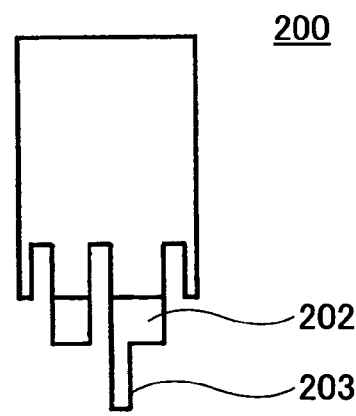
Figure 29C:
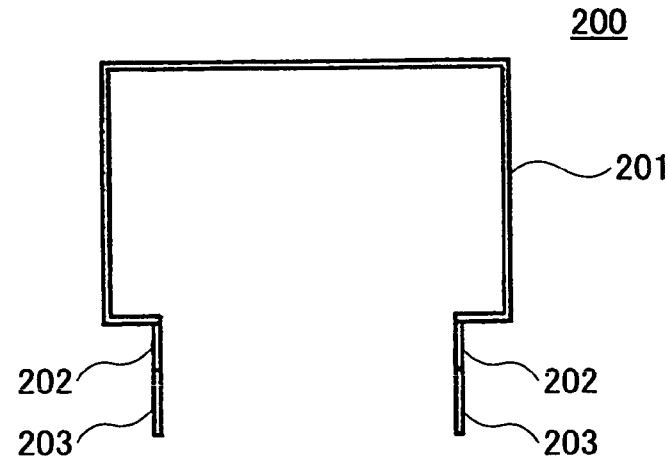

In this optical module cage mounting structure, the optical module cages 30 are disposed spaced apart from the printed circuit board 91 with use of two holding members 200 shown in FIGS. 29A-29C.

Each holding member 200 is formed by pressing a metal sheet and comprises, as shown in FIGS. 29A-29C, a cage holding section 201 for holding the optical module cage 30 in a manner surrounding the optical module cage 30, standoff sections 202 extending downward from the cage holding section 201, and lead sections 203 projecting downward from the corresponding standoff sections 202.

The cage holding sections 201 of the holding members 200 are flexed to widen the lower part and fitted onto the optical module cage 30 from the upper side of the optical module cage 30. Then, the cage holding sections 201 return to the original shape, so that the holding members 200 are attached to the optical module cage 30 at two positions. The lead sections 203 are inserted into through holes in the printed circuit board 91 and soldered such that the holding members 200 are fixed to the printed circuit board 91. The optical module cages 30 are thus held by the cage holding sections 201 and fixed in a position spaced apart from the face 91a of the printed circuit board 91 by the distance corresponding to the height of the standoff section 202.

While the present invention has been described in terms of preferred embodiments, it will be apparent to those skilled in the art that variations and modifications may be made without departing from the scope of the invention as set forth in the accompanying claims.

The present application is based on Japanese Priority Application No. 2006-086534 filed on Mar. 27, 2006, with the Japanese Patent Office, the entire contents of which are hereby incorporated by reference.

What is claimed is:

1. An optical module cage mounting structure wherein at least two optical module cages each including a cage body of a box shape with a size corresponding to an optical module, into which cage body the optical module is inserted, are mounted oppositely on opposite faces of a printed circuit board such that each cage body is spaced apart from the face of the printed circuit board by equal to or greater than 1.5 mm, wherein the face of the printed circuit board exists directly under the cage body.

2. An optical module cage mounting structure wherein at least two optical module cages each including a cage body of a box shape with a size corresponding to an optical module, into which cage body the optical module is inserted, are mounted oppositely on opposite faces of a printed circuit board, comprising:

a spacing structure section, for each of the optical module cages, that spaces the cage body apart from the face of the printed circuit board by equal to or greater than 1.5 mm, wherein the face of the printed circuit board exists directly under the cage body.

3. An optical module cage mounting structure wherein an optical module cage including a cage body of a box shape with a size corresponding to an optical module, into which cage body the optical module is inserted, is mounted on a printed circuit board, comprising:

a spacing structure section that spaces the cage body apart from a face of the printed circuit board by equal to or greater than 1.5 mm; and a radiating structure section on a lower face of a bottom plate of the cage body;

wherein the face of the printed circuit board exists directly under the cage body.

4. The optical module cage mounting structure as claimed in claim 2, wherein the spacing structure section includes a standoff section formed on the optical module cage.

5. The optical module cage mounting structure as claimed in claim 2, wherein the spacing structure section includes a separate member from the optical module cage.

6. The optical module cage mounting structure as claimed in claim 3, wherein the radiating structure section includes a plurality of bosses or a plurality of cut and bent pieces formed on the bottom plate of the cage body to project downward.

7. The optical module cage mounting structure as claimed in claim 3, wherein the radiating structure section includes a heat sink attached to the bottom plate of the cage body.

8. An optical module cage to be mounted on a printed circuit board, comprising:

a cage body of a box shape with a size corresponding to an optical module into which cage body the optical module is inserted;

a standoff section projecting downward from a bottom plate section of the cage body; and a radiating section formed on the bottom plate section of the cage body to project downward;

wherein a face of the printed circuit board exists directly under the cage body;

and wherein the distance between the cage body and the face of the printed circuit board is equal to or greater than 1.5 mm.

9. An optical module cage to be mounted on a printed circuit board, comprising:

a cage body of a box shape with a size corresponding to an optical module into which cage body the optical module is inserted;

a standoff section projecting downward from a bottom plate section of the cage body; and a heat sink holding section formed on the bottom plate section of the cage body to project downward so as to hold a heat sink;

wherein a face of the printed circuit board exists directly under the cage body;

and wherein the distance between the cage body and the face of the printed circuit board is equal to or greater than 1.5 mm.

10. A plug-in unit to be mounted in a device casing, comprising:

at least two optical module cages mounted oppositely on opposite faces of a printed circuit board, each of the optical module cages including a cage body of a box shape with a size corresponding to an optical module into which cage body the optical module is inserted;

wherein each of the cage bodies of the optical module cages is spaced apart from the face of the printed circuit board by equal to or greater than 1.5 mm, and wherein the face of the printed circuit board exists directly under the cage body.

11. A plug-in unit to be mounted in a device casing, comprising:

a plurality of optical module cages aligned and mounted on a printed circuit board, each of the optical module cages including a cage body of a box shape with a size corresponding to an optical module into which cage body the optical module is inserted;

wherein the cage bodies of the optical module cages are spaced apart from a face of the printed circuit board by equal to or greater than 1.5 mm; and electronic components are mounted under the cage bodies on the printed circuit board;

wherein a heat sink is attached to a lower face of a bottom plate section of the cage body of one or more of the optical module cages;

wherein the face of the printed circuit board exists directly under the cage body.

12. The plug-in unit as claimed in claim 11, wherein the heat sink has an elongated shape and is attached to the lower faces of the bottom plate sections of the cage bodies of the optical module cages in a manner that extends across the optical module cages.

13. A communication device comprising:
the device casing in which the plug-in unit of claim 10 is mounted.

14. A communication device comprising:
the device casing in which the plug-in unit of claim 11 is mounted.

* * * * *